United States Patent
Mizusaki et al.

(10) Patent No.: US 11,581,642 B2
(45) Date of Patent: Feb. 14, 2023

(54) SEALING MATERIAL COMPOSITION, LIQUID CRYSTAL CELL AND SCANNING ANTENNA

(71) Applicant: SHARP KABUSHIKI KAISHA, Sakai (JP)

(72) Inventors: Masanobu Mizusaki, Sakai (JP); Kiyoshi Minoura, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 362 days.

(21) Appl. No.: 16/637,690

(22) PCT Filed: Aug. 3, 2018

(86) PCT No.: PCT/JP2018/029190
§ 371 (c)(1),
(2) Date: Feb. 7, 2020

(87) PCT Pub. No.: WO2019/031401
PCT Pub. Date: Feb. 14, 2019

(65) Prior Publication Data
US 2021/0132423 A1 May 6, 2021

(30) Foreign Application Priority Data
Aug. 10, 2017 (JP) .............. JP2017-155225

(51) Int. Cl.
*C09K 19/54* (2006.01)
*H01Q 3/34* (2006.01)
*C09K 19/04* (2006.01)
*C09K 19/18* (2006.01)
*G02F 1/1339* (2006.01)

(52) U.S. Cl.
CPC ............. *H01Q 3/34* (2013.01); *C09K 19/04* (2013.01); *C09K 19/18* (2013.01); *C09K 19/544* (2013.01); *C09K 2019/0444* (2013.01); *C09K 2323/05* (2020.08); *C09K 2323/057* (2020.08); *G02F 1/1339* (2013.01)

(58) Field of Classification Search
CPC ...... C09K 19/04; C09K 19/18; C09K 19/544; C09K 2019/0444; C09K 2323/05; C09K 2323/057
USPC ....................................................... 428/1.5
See application file for complete search history.

(56) References Cited

U.S. PATENT DOCUMENTS

| | | |
|---|---|---|
| 2007/0273599 A1 | 11/2007 | Haziza |
| 2008/0036664 A1 | 2/2008 | Haziza |
| 2008/0048922 A1 | 2/2008 | Haziza |

(Continued)

FOREIGN PATENT DOCUMENTS

| | | | |
|---|---|---|---|
| CN | 105368465 A | | 3/2016 |
| JP | 2006003434 A | * | 1/2006 |

(Continued)

*Primary Examiner* — Ruiyun Zhang
(74) *Attorney, Agent, or Firm* — ScienBiziP, P.C.

(57) ABSTRACT

The sealing material composition of the disclosure includes an unsaturated carbonyl compound having at least two unsaturated carbonyl groups and a curing agent that is thermally reactive with the unsaturated carbonyl compound and contains a compound having at least two of one or more kinds of functional groups selected from the group consisting of a mercaptan group, a hydroxyl group, and a secondary amine group.

17 Claims, 10 Drawing Sheets

(56) References Cited

U.S. PATENT DOCUMENTS

| | | |
|---|---|---|
| 2008/0111755 A1 | 5/2008 | Haziza |
| 2008/0117113 A1 | 5/2008 | Haziza |
| 2008/0117114 A1 | 5/2008 | Haziza |
| 2008/0316142 A1 | 12/2008 | Haziza |
| 2009/0058747 A1 | 3/2009 | Haziza |
| 2009/0091500 A1 | 4/2009 | Haziza |
| 2012/0194399 A1 | 8/2012 | Bily et al. |
| 2014/0266946 A1 | 9/2014 | Bily et al. |
| 2015/0229028 A1 | 8/2015 | Bily et al. |
| 2016/0040066 A1 | 2/2016 | Wittek et al. |
| 2016/0359234 A1 | 12/2016 | Bily et al. |
| 2016/0372834 A1 | 12/2016 | Bily et al. |
| 2017/0130129 A1 | 5/2017 | Wittek et al. |

FOREIGN PATENT DOCUMENTS

| | | |
|---|---|---|
| JP | 2006003434 A | 1/2006 |
| JP | 2009-538565 A | 11/2009 |
| JP | 2011-150181 A | 8/2011 |
| JP | 2013-539949 A | 10/2013 |
| JP | 2016-037607 A | 3/2016 |
| JP | 2016-512408 A | 4/2016 |
| WO | 2012/132203 A1 | 10/2012 |
| WO | 2017/115672 A1 | 7/2017 |

\* cited by examiner

SEALING MATERIAL COMPOSITION, LIQUID CRYSTAL CELL AND SCANNING ANTENNA

TECHNICAL FIELD

The disclosure relates to a sealing material composition, a liquid crystal cell, and a scanning antenna.

BACKGROUND ART

Antennas used in applications such as mobile communications and satellite broadcasting require a beam scanning function that can change the beam direction. As antennas having such a function, scanning antennas that utilize the high dielectric anisotropy (birefringence index) of liquid crystal materials (including nematic liquid crystals and polymer dispersed liquid crystals) have been proposed (see PTL 1 to PTL 3 for example)). This type of scanning antenna includes a liquid crystal cell having a liquid crystal layer interposed between a pair of substrates having electrodes.

CITATION LIST

Patent Literature

PTL 1: JP 2013-539949 T
PTL 2: JP 2016-512408 T
PTL 3: JP 2009-538565 T

Technical Problem

Scanning antennas require the use of a liquid crystal compound having a sufficient level of anisotropy of dielectric constant (Δε) in the gigahertz band. Therefore, as the liquid crystal compound for a scanning antenna, use of an isothiocyanate group-containing liquid crystal compound having high anisotropy of dielectric constant is substantially becoming a necessity.

Incidentally, as a sealing material for sealing a liquid crystal layer between substrates of a liquid crystal cell, a product of a reaction between an epoxy compound and a curing agent (for example, an amine-based, hydrazide-based, or mercaptan-based curing agent) is used. However, since the reaction product (hereinafter, the epoxy-derived component) has a functional group (OH group) containing a highly reactive hydrogen group, when, for example, an isothiocyanate group-containing liquid crystal compound is used as the liquid crystal layer, the isothiocyanate group-containing liquid crystal compound and the epoxy-derived component may react, and the reaction product may precipitate in the liquid crystal layer. Here, the precipitate formed in the liquid crystal layer will be described in detail with reference to FIG. 1. As illustrated in FIG. 1, the sealing material includes primarily an epoxy-derived component (a-3) that is a reaction product of an epoxy compound (a-1) and a curing agent (a-2) such as an amine-based curing agent. When the epoxy compound (a-1) and the curing agent (a-2) react, the epoxy-derived component (a-3) with a functional group (OH group) containing a highly reactive hydrogen group is formed. When such an epoxy-derived component (a-3) reacts with the isothiocyanate group-containing liquid crystal compound (a-4) in the liquid crystal layer, a compound (a-5) having a "—NH—CS—N—" bond and a compound (a-6) having a "—NH—CS—O—" bond are formed, as illustrated in FIG. 1. Since the "—NH—CS—N—" bond and the "—NH—CS—O—" bond are both polar, the compound (a-5) and the compound (a-6) in the liquid crystal layer do not remain dissolved and form precipitates. The precipitates are easily produced particularly in a high temperature environment (for example, 90° C. or higher, and in some instances, 80° C. or higher). When such precipitates are generated in, for example, a liquid crystal cell for a scanning antenna, malfunctions occur in the scanning antenna, which is problematic.

SUMMARY

Thus, an object of the disclosure is to provide a sealing material composition that suppresses the formation of precipitates in a liquid crystal layer of a liquid crystal cell used in an application such as a scanning antenna.

The sealing material composition according to the disclosure includes: an unsaturated carbonyl compound having at least two unsaturated carbonyl groups; and a curing agent that is thermally reactive with the unsaturated carbonyl compound and includes a compound having at least two of one or more kinds of functional groups selected from the group consisting of a mercaptan group, a hydroxyl group, and a secondary amine group.

In the sealing material composition, the unsaturated carbonyl group is preferably constituted by a group represented by Chemical Formula (1) below.

[Chemical Formula 1]

$$*-\underset{\underset{O}{\|}}{C}-CH=CHR \tag{1}$$

In Chemical Formula (1) above, R is H or an alkyl group represented by $C_mH_{2m+1}$, m is any integer from 1 to 6, and * is an atomic bond.

In the sealing material composition, the unsaturated carbonyl compound preferably includes any of structures represented by Chemical Formulas (2-1) to (2-8) as a molecular chain bonded to the unsaturated carbonyl group.

[Chemical Formula 2]

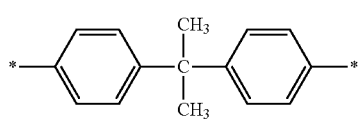

(2-1)

(2-2)

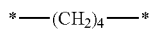 (2-3)

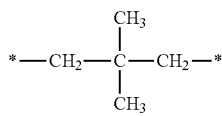 (2-4)

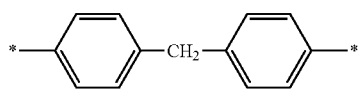 (2-5)

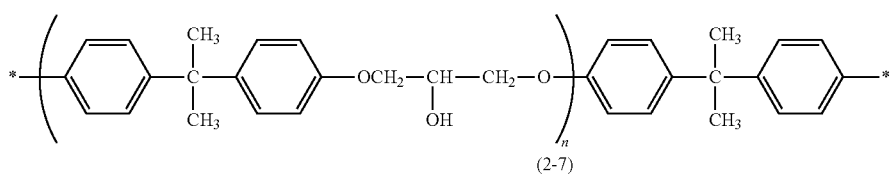 (2-6)

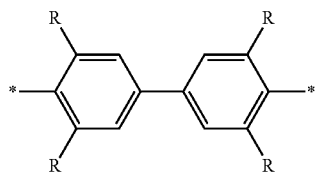  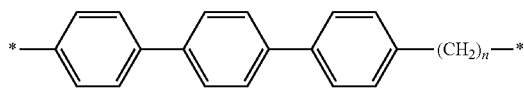 (2-7) (2-8)

In Chemical Formulas (2-1) to (2-8) above, "*" is an atomic bond linked to the unsaturated carbonyl group; in Chemical Formula (2-6), n is any integer from 1 to 5; in Chemical Formula (2-7), R is H or $CH_3$; and in Chemical Formula (2-8), n is any integer from 0 to 12.

In the sealing material composition, preferably, the curing agent is made from a mercaptan group-containing compound for which the functional group is the mercaptan group.

In the sealing material composition, preferably, the curing agent, is made from a secondary amine group-containing compound for which the functional group is the secondary amine group.

In addition, a liquid crystal cell according to the disclosure includes a liquid crystal layer, a pair of mutually facing substrates including a first substrate and a second substrate, sandwiching the liquid crystal layer, and a sealing material made from a cured product of any of the sealing material compositions above, and interposed between the pair of substrates in a manner of adhering to each of the pair of substrates while surrounding the liquid crystal layer.

In addition, a scanning antenna according to the disclosure has a plurality of antenna units arranged therein and includes: a TFT substrate having a first dielectric substrate, a plurality of TFTs supported by the first dielectric substrate, and a plurality of patch electrodes electrically connected to the TFTs; a slot substrate having a second dielectric substrate and a slot electrode including a plurality of slots formed on a first main surface of the second dielectric substrate; a liquid crystal layer provided between the ITT substrate and the slot substrate; a reflective conductive plate disposed in a manner of opposing a second main surface opposite the first main surface of the second dielectric substrate with a dielectric layer interposed therebetween; and a sealing material made from a cured product of any of the sealing material compositions described above, the sealing material being interposed between the TFT substrate and the slot substrate in a manner of adhering to each of the TFT substrate and the slot substrate while surrounding the liquid crystal layer.

In the scanning antenna, the liquid crystal layer preferably includes an isothiocyanate group-containing liquid crystal compound.

In the scanning antenna, the isothiocyanate group-containing liquid crystal compound preferably includes a structure represented by Chemical Formula (3-1) or (3-2) below.

[Chemical Formula 3]

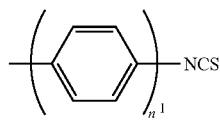 (3-1)

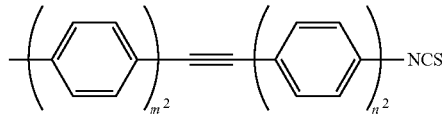 (3-2)

In Chemical Formulas (3-1) and (3-2) above, $n^1$, $m^2$, and $n^2$ are each any integer from 1 to 5, and H in the phenylene group may be substituted with F or Cl.

Advantageous Effects of Disclosure

According to the disclosure, a scaling material composition or the like that suppresses the formation of precipitates in a liquid crystal layer of a liquid crystal cell used in an application such as a scanning antenna can be provided.

DESCRIPTION OF EMBODIMENTS

First Embodiment

Basic Structure of Scanning Antenna

A scanning antenna has a beam scanning function capable of changing the beam direction, and has a structure including a plurality of antenna units that utilize the anisotropy (birefringence index) of a large dielectric constant M ($\varepsilon M$) of a liquid crystal material. By controlling the voltage applied to the liquid crystal layer of each antenna unit and changing the effective dielectric constant M ($\varepsilon M$) of the liquid crystal layer of each antenna unit, the scanning antenna forms a two-dimensional pattern with a plurality of antenna units having different capacitances. Since the dielectric constant of the liquid crystal material has a frequency dispersion, in the present specification, the dielectric constant in the microwave frequency hand is particularly denoted as the "dielectric constant M ($\varepsilon M$)".

A phase difference according to the capacitance of each antenna unit is applied to electromagnetic waves (for example, microwaves) emitted from a scanning antenna or received by a scanning antenna, and thereby the electromagnetic waves have strong directivity in a specific direction depending on the two-dimensional pattern formed by the plurality of antenna units having different capacitances (beam scanning). For example, an electromagnetic wave emitted from a scanning antenna is obtained by integrating the spherical waves obtained as a result of input electromagnetic waves being incident on and then scattered by each antenna unit, in consideration of the phase difference provided by each antenna unit.

Figure 2:
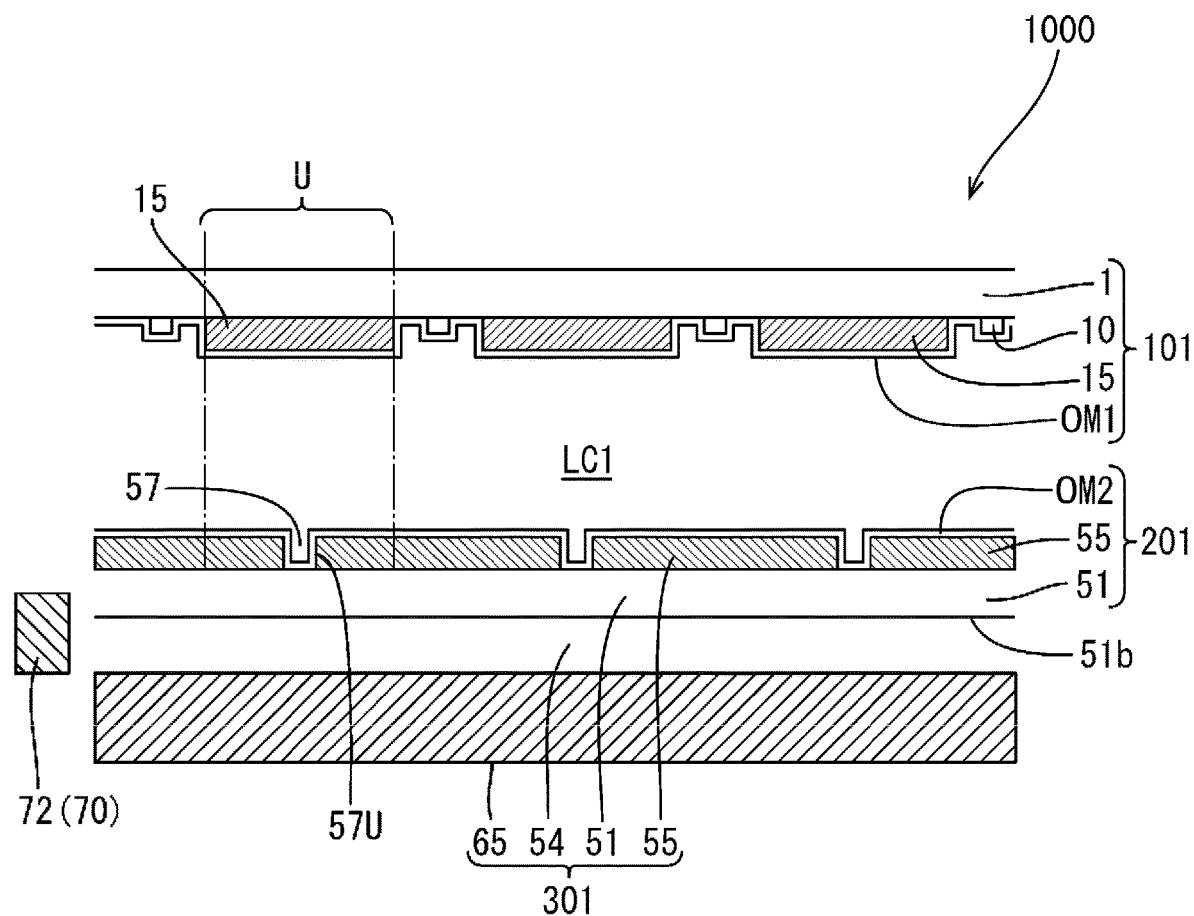
FIG. 2 is a cross-sectional view schematically illustrating a portion of the scanning antenna according to a first embodiment.

A basic structure of the scanning antenna according to are embodiment of the disclosure will now be described with reference to FIG. 2 and the like. FIG. 2 is a cross-sectional view schematically illustrating a portion of a scanning antenna 1000 according to a first embodiment. The scanning antenna 1000 is a radial in-line slot antenna in which slots 57 are concentrically arranged. FIG. 2 schematically illustrates a portion of a cross-section along a radial direction from a power feed pin 72 provided near the center the concentrically arranged slots. Note that in other embodiments, the arrangement of slots may be a variety of known arrangements (for example, helical or matrix-shaped).

The scanning antenna 1000 is provided primarily with a TFT substrate 101 (one example of the first substrate), a slot substrate 201 (one example of the second substrate), a liquid crystal layer LC provided therebetween, and a reflective conductive plate 65. The scanning antenna 1000 is configured to transmit and receive microwaves from the TFT substrate 101 side. The TFT substrate 101 and the slot substrate 201 are arranged to oppose each other with the liquid crystal layer LC interposed therebetween.

The TFT substrate 101 (one example of the first substrate) includes: a dielectric substrate (one example of the first dielectric substrate) 1 such as a glass substrate; a plurality of patch electrodes 15 and a plurality of thin film transistors (TFT) 10 formed on the liquid crystal layer LC side of the dielectric substrate 1; and an alignment film OM1 formed on the outermost surface of the liquid crystal layer LC side. A gate bus line and a source bus line not illustrated in FIG. 2 are connected to each TFT 10.

The slot substrate 201 (one example of the second substrate) is provided with: a dielectric substrate (one example of the second dielectric substrate) 51 such as a glass substrate; a slot electrode 55 formed on the liquid crystal layer LC side of the dielectric substrate 51; and an alignment film OM2 formed on the outermost surface of the liquid crystal layer LC side. The slot electrode 55 includes a plurality of slots 57. Note that the surface of the dielectric substrate 51 on the liquid crystal layer LC side is referred to as a first main surface, and the surface on the opposite side is referred to as a second main surface.

The dielectric substrates 1, 51 used in the TFT substrate 101 and the slot substrate 201 preferably have a small dielectric loss with respect to microwaves, and in addition to glass substrates, plastic substrates can be used. The thickness of the dielectric substrates 1, 51 is not particularly limited, but for example, is preferably 400 µm or less, and more preferably 300 µm or less. Note that the lower limit of the thickness of the dielectric substrates 1, 51 is not particularly limited as long as the thickness provides sufficient strength for withstanding the manufacturing process and the like.

The reflective conductive plate 65 is disposed opposing the slot substrate 201 with an air layer 54 interposed therebetween. In other words, the reflective conductive plate 65 is disposed opposing the second main surface of the dielectric substrate (one example of the second dielectric substrate) 51 of the slot substrate 201 with the air layer (dielectric layer) 54 interposed therebetween. Note that in another embodiment, a layer formed of a dielectric (for example, a fluororesin such as PTFE) having a small dielectric constant M with respect to microwaves may be used in place of the air layer 54. In the scanning antenna 1000 of the present embodiment, the slot electrode 55, the reflective conductive plate 65, and the dielectric substrate 51 and the air layer 54 between the slot electrode 55 and the reflective conductive plate 65 function as a waveguide 301.

A patch electrode 15, a portion of the slot electrode 55 including a slot 57 (may be referred to below as a "slot electrode unit 57U), and the liquid crystal layer LC therebetween constitute an antenna unit U. In each antenna unit U, one island-shaped patch electrode 15 is arranged to oppose one hole-shaped slot 57 (slot electrode unit 57U) with a liquid crystal layer LC interposed therebetween, thereby constituting each liquid crystal capacitance. In the scanning antenna 1000 according to the present embodiment, a plurality of antenna units U are concentrically arranged. Note that the antenna unit U includes an auxiliary capacitance electrically connected in parallel with the liquid crystal capacitance.

The slot electrode 55 configures the antenna unit U in each slot electrode unit 57U, and also functions as a wall of the waveguide 301, Therefore, a function of suppressing the transmission of microwaves is required for the slot electrode 55, and the slot electrode 55 is formed from a relatively thick metal layer. Examples of such a metal layer include a Cu layer and an Al layer. The upper limit of the thickness of the metal layer constituting the slot electrode 55 is not particularly limited, but in view of the formation of the alignment film OM2, it can be said that a thinner metal layer is preferable. Note that use of a Cu layer as the metal layer provides the advantage of enabling the metal layer to be thinner compared to the use of an Al layer. As the method for forming the slot electrode 55, a thin film deposition method that is used with known technologies for liquid crystal display devices, and other methods such as affixing a metal foil (for example, Cu foil or Al foil) onto a substrate may be used. The thickness of the metal layer is set, for example, to a range from 2 μm to 30 μm. In a case where the thin film deposition method is used to form the metal layer, the thickness of the metal layer is set, for example, to 5 μm or less. Note that, for example, an aluminum plate, a copper plate, or the like having a thickness of several mm can be used as the reflective conductive plate 65.

Since the patch electrode 15 does not configure the waveguide 301 like the slot electrode 55, the patch electrode 15 may be configured by a metal layer having a smaller thickness than that of the slot electrode 55. However, to avoid losses resulting from conversion of the vibration of free electrons near the slot 57 of the slot electrode 55 to heat when vibration of free electrons inside the patch electrode 15 is induced, the resistance is preferably low. From viewpoints such as mass productivity, it is preferable to use an Al layer rather than a Cu layer, and the thickness of the Al layer is preferably from 0.5 μm to 2 μm, for example.

As described in PTL 1, the arrangement pitch of the antenna units U is set to, for example, $\lambda/4$ or less, and/or $\lambda/5$ or less when the wavelength of the microwave is $\lambda$. The wavelength $\lambda$ is, for example, 25 mm, and in this case the arrangement pitch is set to not greater than 6.25 mm and/or not greater than 5 mm, for example.

The scanning antenna 1000 changes the phase of microwaves excited (re-radiated) from each patch electrode 15 by changing the capacitance value of the liquid crystal capacitance of the antenna unit U. Accordingly, the liquid crystal layer LC preferably has a large anisotropy ($\Delta\varepsilon M$) of the dielectric constant M ($\varepsilon M$) with respect to microwaves, and preferably has a small tan $\delta M$ (dielectric tangent with respect to microwaves).

While the dielectric constant of a liquid crystal material generally has a frequency dispersion, the dielectric anisotropy $\Delta\varepsilon M$ for microwaves has a positive correlation with the refractive index anisotropy $\Delta n$ with respect to visible light. Accordingly, it can be said that a liquid crystal material having a large refractive index anisotropy $\Delta n$ with respect to visible light is preferable as the liquid crystal material for an antenna unit for microwaves. Here again, in a case where a $\Delta n$ (birefringence index) with respect to light having a wavelength of 550 nm is used as an index, a nematic liquid crystal having a $\Delta n$ of 0.3 or greater, and preferably 0.4 or greater, can be used for an antenna unit for microwaves. The upper limit of the $\Delta n$ is not particularly limited. The thickness of the liquid crystal layer LC is set to, for example, from 1 μm to 500 μm.

Figure 3:
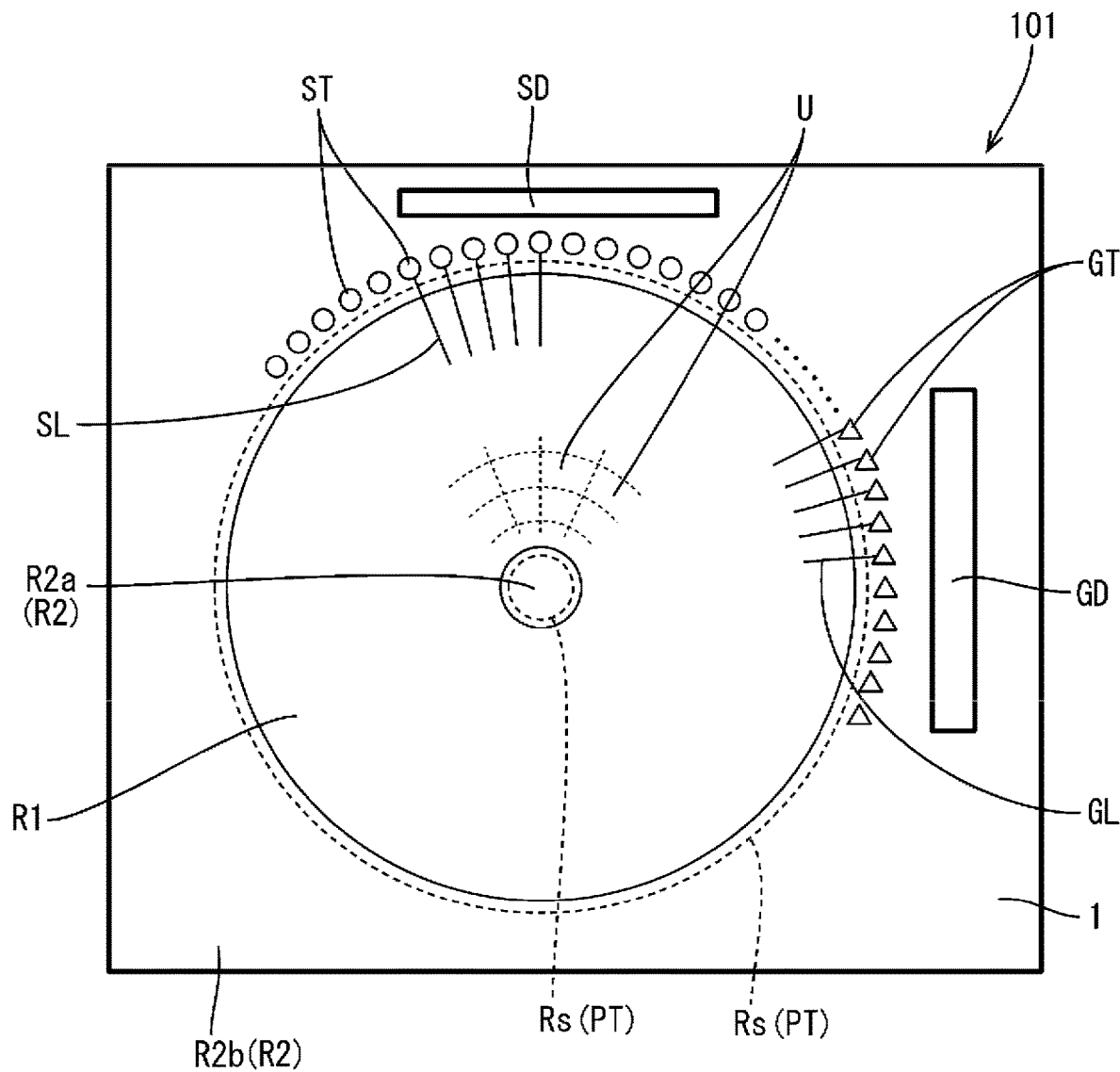
FIG. 3 is a plan view schematically illustrating a TFT substrate included in a scanning antenna.
Figure 4:
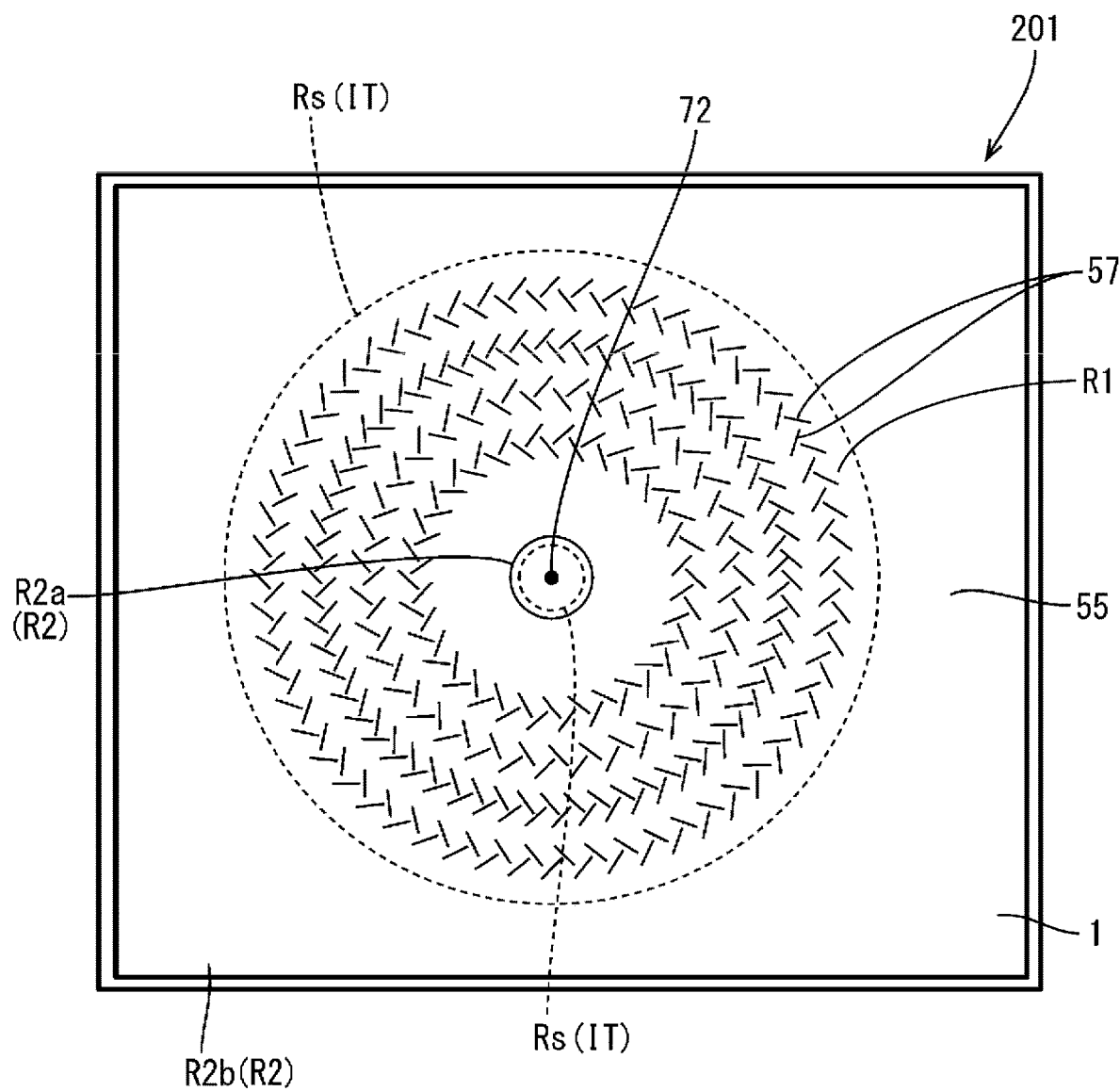
FIG. 4 is a plait view schematically illustrating a slot substrate included in a scanning antenna.

FIG. 3 is a plan view schematically illustrating the TFT substrate 101 included in the scanning antenna 1000, and FIG. 4 is a plan view schematically illustrating the slot substrate 201 provided in the scanning antenna 1000. For convenience of the description, the region of the TFT substrate 101 and the region of the slot substrate 201 corresponding to the antenna unit U will be referred to collectively as an "antenna unit region," and denoted with the same reference sign as the antenna unit. In addition, as illustrated in FIG. 3 and FIG. 4, in the TFT substrate 101 and the slot substrate 201, a region defined by the plurality of two-dimensionally arranged antenna unit regions U is referred to as a "transmission and/or reception region R1," and a region other than the transmission and/or reception region R1 is referred to as a "non-transmission and/or reception region R2." A terminal section, a drive circuit, and the like are provided in the non-transmission and/or reception region R2.

The transmission and/or reception region R1 forms a ring shape from a plan view. The non-transmission and/or reception region R2 includes a first non-transmission and/or reception region R2a located at the center of the transmission and/or reception region R1 and a second non-transmission and/or reception region R2b located at the periphery of the transmission and/or reception region R1. An outer diameter of the transmission and/or reception region R1 is, for example, from 200 mm to 1500 mm, and is set, as appropriate, according to the communication traffic volume or the like.

A plurality of gate bus lines GL and a plurality of source bus lines SL supported by the dielectric substrate 1 are provided in the transmission and/or reception region R1 of the TFT substrate 101, and driving of each antenna unit region Li is controlled using these wiring lines. Each of the antenna unit regions U includes a TFT 10 and a patch electrode 15 electrically connected to the TFT 10. A source electrode of the TFT 10 is electrically connected to the source bus line SL, and a gate electrode is electrically connected to the gate bus line GL. In addition, a drain electrode of the ITT 10 is electrically connected to the patch electrode 15.

In the non-transmission and/or reception region R2 (first non-transmission and/or reception region R2a, second non-transmission and/or reception region R2b), a seal region Rs formed by a sealing material (not illustrated) is disposed to surround the transmission and/or reception region R1. The sealing material bonds the TFT substrate 101 and the slot substrate 201 to each other, and also functions to seal a liquid crystal material (liquid crystal layer LC) between these substrates 101, 201. Note that details of the sealing material will be described below.

A gate terminal section GT, a gate driver CD, a source terminal section ST, and a source driver SD are provided outside the seal region Rs of the non-transmission and/or reception region R2, Each gate bus line GL is connected to the gate driver GD via the gate terminal section GT, and each source bus line SL is connected to the source driver SD via the source terminal section ST. Note that in the present embodiment, although both the source driver SD and the gate driver GD are formed on the dielectric substrate 1 of the TFT substrate 101, one or both of these drivers may be formed on the dielectric substrate 51 of the slot substrate 201.

Moreover, a plurality of transfer terminal sections PT are provided in the non-transmission and/or reception region R2. The transfer terminal section PT is electrically connected to the slot electrode 55 of the slot substrate 201. In the present embodiment, a transfer terminal section PT is disposed in both the first non-transmission and/or reception region R2a and the second non-transmission and/or reception region R2b. In other embodiments, a configuration may be adopted in which the transfer terminal section PT is disposed in only one of the regions. In addition, in the case of the present embodiment, the transfer terminal section PT is disposed in the seal region Rs. Therefore, a conductive resin containing conductive particles (conductive beads) is used as the sealing material.

As illustrated in FIG. 4, in the slot substrate 201, the slot electrode 55 is formed on the dielectric substrate 51, the slot electrode 55 extending across the transmission and/or reception region R1 and the non-transmission and/or reception region R2. Note that FIG. 4 illustrates the surface of the slot substrate 201 as viewed from the liquid crystal layer LC side, and for convenience of explanation, the alignment film OM2 formed on the outermost surface is removed.

In the transmission and/or reception region R1 of the slot substrate 201, a plurality of slots 57 are provided in the slot electrode 55. These slots 57 are allocated to the antenna unit regions U of the TFT substrate 101, one slot 57 to one antenna unit region U. In the present embodiment, with the plurality of slots 57, a pair of slots 57 extending in directions substantially orthogonal to each other are concentrically disposed to configure a radial in-line slot antenna. Since the scanning antenna 1000 includes such pairs of slots 57, the scanning antenna 1000 can transmit and/or receive circularly polarized waves.

A plurality of terminal sections IT of the slot electrode 55 are provided in the non-transmission and/or reception region R2 of the slot substrate 201. The terminal section IT is electrically connected to the transfer terminal section PT of the TFT substrate 101. In the present embodiment, the terminal section IT is disposed within the seal region Rs, and is electrically connected to a corresponding transfer terminal section PT by a sealing material made from a conductive resin containing conductive particles (conductive beads) as described above.

Furthermore, the power feed pin 72 is provided in the first non-transmission and/or reception region R2a and disposed in the center of a concentric circle formed by the slots 57. Through the power feed pin 72, microwaves are supplied to the waveguide 301 configured by the slot electrode 55, the reflective conductive plate 65, and the dielectric substrate 51. The power feed pin 72 is connected to a power feed device 70. The power feed method may be either a direct coupling power feed method or an electromagnetic coupling method, and a known power feed structure can be adopted.

The TFT substrate 101, the slot substrate 201, and the waveguide 301 will be described in detail below.

Structure of the TFT Substrate 101

Figure 5:
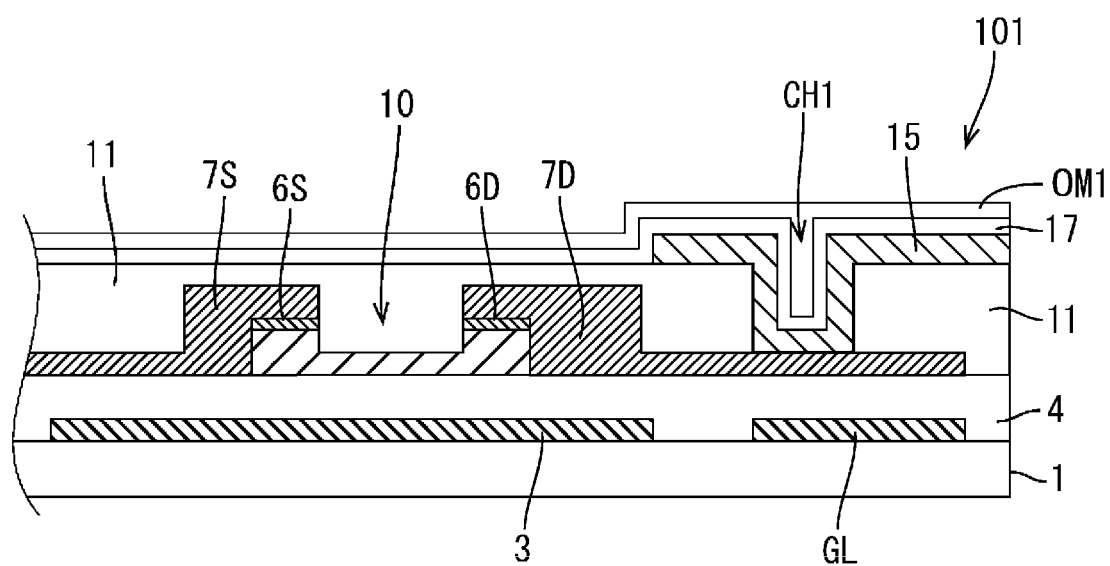
FIG. 5 is a cross-sectional view schematically illustrating an antenna unit region of the TFT substrate.
Figure 6:
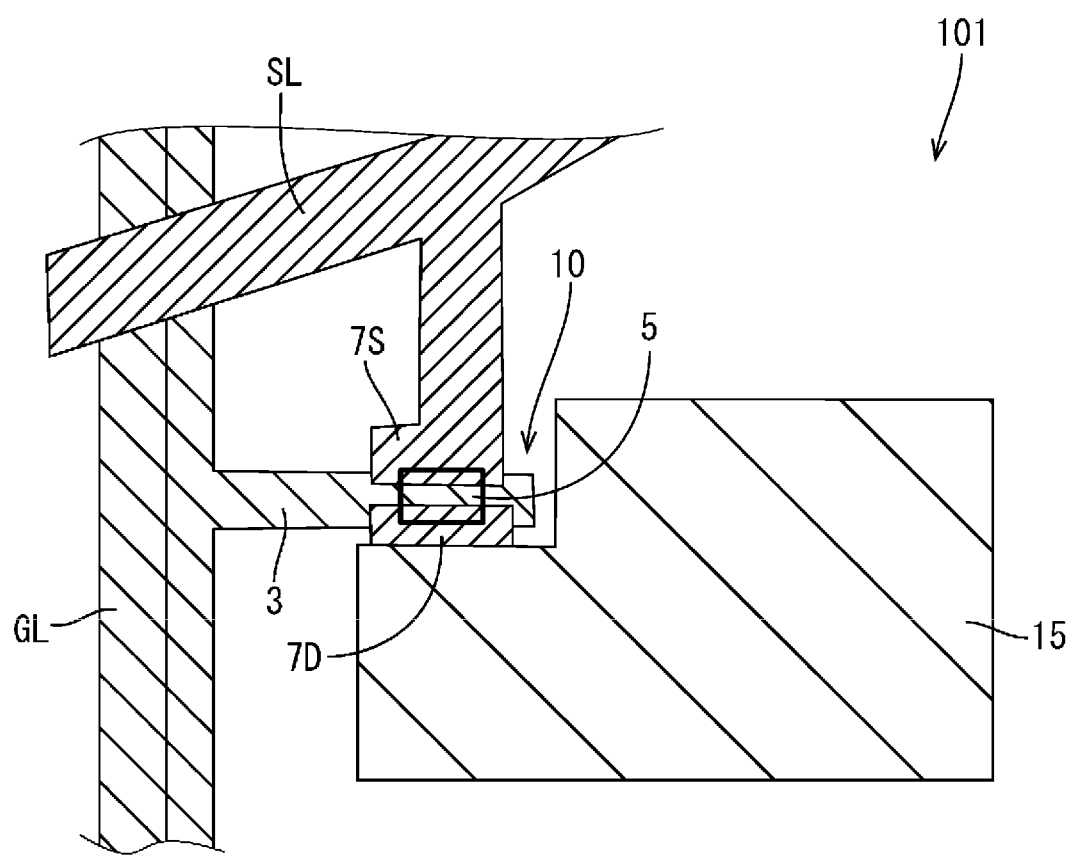
FIG. 6 is a plan view schematically illustrating the antenna unit region of the TFT substrate.

FIG. 5 is a cross-sectional view schematically illustrating the antenna unit region U of the TET substrate 101, and FIG. 6 is a plan view schematically illustrating the antenna unit region U of the TFT substrate 101. FIGS. 5 and 6 each illustrate a cross-sectional configuration of a portion of the transmission and/or reception region R1.

Each of the antenna unit regions U of the TFT substrate 101 includes a dielectric substrate (first dielectric substrate) 1, a TFT 10 supported by the dielectric substrate 1, a first insulating layer 11 covering the TFT 10, a patch electrode 15 formed on the first insulating layer 11 and electrically connected to the TFT 10, a second insulating layer 17 covering the patch electrode 15, and an alignment film OM1 covering the second insulating layer 17.

The TFT 10 is provided with a gate electrode 3, an island-shaped semiconductor layer 5, a gate insulating layer 4 disposed between the gate electrode 3 and the semiconductor layer 5, a source electrode 7S, and a drain electrode 7D. The TFT 10 of the present embodiment is a channel etched type TFT having a bottom gate structure. Note that in other embodiments, a TFT of another structure may be used.

The gate electrode 3 is electrically connected to the gate bus line GL, and a scanning signal is supplied from the gate bus line GL. The source electrode 7S is electrically connected to the source bus line SL, and a data signal is supplied from the source bus line SL. The gate electrode 3 and the gate bus line GL may be formed of the same conductive film (gate conductive film). Moreover, the source electrode 7S, the drain electrode 7D, and the source bus line SL may be formed from the same conductive film (source conductive film). The gate conductive film and the source conductive film are, for example, made from metal films. Note that a layer formed using a gate conductive film may be referred to as a "gate metal layer," and a layer formed using a source conductive film may be referred to as a "source metal layer."

The semiconductor layer 5 is disposed overlapping the gate electrode 3 with the gate insulating layer 4 interposed therebetween. As illustrated in FIG. 5, a source contact layer 6S and a drain contact layer 6D are formed on the semiconductor layer 5. The source contact layer 6S and the drain contact layer 6D are disposed on both sides, respectively, of a region (channel region) where a channel is formed in the semiconductor layer 5, in an opposing manner. In the present embodiment, the semiconductor layer 5 is made from an intrinsic amorphous silicon (i-a-Si) layer, and the source contact layer 6S and the drain contact layer 6D are made from $n^+$ type amorphous silicon ($n^+$-a-Si) layers. Note that in other embodiments, the semiconductor layer 5 may be configured from a polysilicon layer, an oxide semiconductor layer, or the like.

The source electrode 7S is provided in contact with the source contact layer 6S and is connected to the semiconductor layer 5 with the source contact layer 6S interposed therebetween. The drain electrode 7D is provided in contact with the drain contact layer 6D and is connected to the semiconductor layer 5 with the drain contact layer 6D interposed therebetween. The first insulating layer 11 includes a contact hole CH1 that reaches the drain electrode 7D of the TFT 10.

The patch electrode 15 is provided on the first insulating layer 11 and within the contact hole CH1, and is in contact with the drain electrode 7D in the contact hole CH1. The patch electrode 15 is mainly composed of a metal layer. Note that the patch electrode 15 may be a metal electrode formed only from a metal layer. The material of the patch electrode 15 may be the same as that of the source electrode 7S and the drain electrode 7D. The thickness of the metal layer in the patch electrode 15 (the thickness of the patch electrode 15 when the patch electrode 15 is a metal electrode) may be the same as the thicknesses of the source electrode 7S and the drain electrode 7D, but is preferably greater. When the thickness of the patch electrode 15 is greater, the transmittance of electromagnetic waves is suppressed to a low level, the sheet resistance of the patch electrode is reduced, and loss resulting from conversion of the vibration of free electrons in the patch electrode to heat can be reduced.

A CS bus line CL may be provided using the same conductive film as that of the gate bus line GL. The CS bus line CL may be disposed overlapping the drain electrode 7D (or an extended portion of the drain electrode 7D) with the gate insulating layer 4 interposed therebetween, and may constitute an auxiliary capacitance CS having the gate insulating layer 4 as a dielectric layer.

In the present embodiment, the patch electrode 15 is formed in a layer that differs from the source metal layer. Therefore, the configuration is such that the thickness of the source metal layer and the thickness of the patch electrode 15 can be controlled independently of each other.

The patch electrode 15 may include a Cu layer or an Al layer as a main layer. The performance of the scanning antenna correlates with the electrical resistance of the patch electrode 15, and the thickness of the main layer is set to obtain a desired resistance. However, it is preferable that the resistance of the patch electrode 15 be low enough that electron vibration is not hindered. When the metal layer of the patch electrode 15 is formed using an Al layer, the thickness of the metal layer is set to, for example, greater than or equal to 0.5 μm.

As an example, the TFT substrate 101 can be manufactured by the following method. First, a dielectric substrate 1 is prepared. For example, a glass substrate, a plastic substrate having heat resistance, or the like can be used as the dielectric substrate 1. Subsequently, a gate metal layer including the gate electrode 3 and the gate bus line GL is formed on such a dielectric substrate 1.

The gate electrode 3 can be formed integrally with the gate bus line GL. Here, a gate conductive film (thickness: from 50 nm to 500 nm for example) is formed on the dielectric substrate 1 by a method such as sputtering. Next, the gate conductive film is patterned to form the gate electrode 3 and the gate bus line GL. The material of the gate conductive film is not particularly limited, and for example, a film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used. Here, as a gate conductive film, a layered film is formed by layering MoN (having a thickness of 50 nm, for example), Al (having a thickness of 200 nm, for example), and MoN (having a thickness of 50 nm, for example) in this order.

Next, the gate insulating layer 4 is formed to cover the gate metal layer. The gate insulating layer 4 can be formed by a CVD method or the like. As the gate insulating layer 4, a silicon dioxide ($SiO_2$) layer, a silicon nitride (SiNx) layer, a silicon oxynitride (SiOxNy; x>y) layer, a silicon nitride oxide (SiNxOy; x>y) layer, or the like may be used as appropriate. The gate insulating layer 4 may have a layered structure. Here, a SiNx layer (having a thickness of 410 nm, for example) is formed as the gate insulating layer 4.

Next, the semiconductor layer 5 and a contact layer are formed on the gate insulating layer 4. Here, an intrinsic amorphous silicon film (with a thickness of 125 nm, for example) and an n⁺ type amorphous silicon film (with a thickness of 65 nm, for example) are formed in this order and patterned to obtain an island-shaped semiconductor layer 5 and a contact layer. Note that the semiconductor film used for the semiconductor layer 5 is not limited to an amorphous silicon film. For example, an oxide semiconductor layer may be formed as the semiconductor layer 5. In this case, it is not necessary to provide a contact layer between the semiconductor layer 5 and the source/drain electrodes.

Next, a source conductive film (having a thickness of from 50 nm to 500 nm, for example) is formed on the gate insulating layer 4 and the contact layer, and patterned to form a source metal layer including the source electrode 7S, the drain electrode 7D, and the source bus line SL. At this time, the contact layer is also etched, and the source contact layer 6S and the drain contact layer 6D are formed to be separated from each other.

The material of the source conductive film is not particularly limited, and for example, a film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used. Here, as a source conductive film, a layered film is formed by layering MoN (having a thickness of 30 nm, for example), Al (having a thickness of 200 nm, for example), and MoN (having a thickness of 50 nm, for example) in this order.

Here, for example, a source conductive film is formed by a sputtering method, and the source conductive film is patterned by wet etching (with source/drain separation). Subsequently, a portion of the contact layer located on the region that will serve as the channel region of the semiconductor layer 5 is removed by dry etching, for example, to form a gap portion, and the source contact layer 6S and the drain contact layer 6D are separated. At this time, in the gap portion, the area around the surface of the semiconductor layer 5 is also etched (overetching).

Next, the first insulating layer 11 is formed to cover the TFT 10. In this example, the first insulating layer 11 is disposed so as to be in contact with the channel region of the semiconductor layer 5. In addition, the contact hole CH1 that reaches the drain electrode 7D is formed in the first insulating layer 11 by a known photolithographic method.

The first insulating layer 11 may be an inorganic insulating layer such as a silicon dioxide ($SiO_2$) film, a silicon nitride (SiNx) film, a silicon oxynitride (SiOxNy; x>y) film, or a silicon nitride oxide (SiNxOy; x>y) film, for example. Here, as the first insulating layer 11, a SiNx layer having a thickness of 330 nm, for example, is formed by a CVD method for example.

Next, a patch conductive film is formed on the first insulating layer 11 and within the contact hole CH1, and is then patterned. In this way, the patch electrode 15 is formed in the transmission and/or reception region R1. Note that a patch connection section made from the same conductive film (patch conductive film) as the patch electrode 15 is formed in the non-transmission and/or reception region R2. The patch electrode 15 is in contact with the drain electrode 7D within the contact hole CH1.

The same material as that of the gate conductive film or the source conductive film can be used as the material of the patch conductive film. However, the patch conductive film is desirably set to be thicker than the gate conductive film and the source conductive film. A suitable thickness of the patch conductive film is, for example, from 1 μm to 30 μm. In a case where the thickness of the patch conductive film becomes thinner than this, the transmittance of the electromagnetic waves becomes roughly 30%, the sheet resistance becomes greater than or equal to 0.03 Ω/sq, and there is a possibility of the loss becoming larger, and conversely in a case where the thickness of the patch conductive film is thicker than this, there is a possibility of deterioration of the patterning properties of the slots 57.

Here, as a patch conductive film, a layered film (MoN/Al/MoN) is formed by layering MoN (having a thickness of 50 nm, for example), Al (having a thickness of 1000 nm, for example), and MoN (having a thickness of 50 nm, for example) in this order.

Next, a second insulating layer (having a thickness of from 100 nm to 300 nm, for example) 17 is formed on the patch electrode 15 and the first insulating layer 11. The second insulating layer 17 is not particularly limited, and, for example, a silicon dioxide ($SiO_2$) film, a silicon nitride (SiNx) film, a silicon oxynitride (SiOxNy; x>y) film, a silicon nitride oxide (SiNxOy; x>y) film, or the like can be used as appropriate. Here, as the second insulating layer 17, for example, a SiNx layer having a thickness of 200 nm is formed.

Subsequently, the inorganic insulating films (the second insulating layer 17, the first insulating layer 11, and the gate insulating layer 4) are etched collectively by dry etching using a fluorine-based gas, for example. In etching, the patch electrode 15, the source bus line SL, and the gate bus line GL each function as an etch stop. Through this, a second contact hole that reaches the gate bus line GL is formed in the second insulating layer 17, the first insulating layer 11, and the gate insulating layer 4, and a third contact hole that reaches the source bus line SL is formed in the second insulating layer 17 and the first insulating layer 11. In addition, a fourth contact hole that reaches the patch connection section described above is formed in the second insulating layer 17.

Next, a conductive film (having a thickness of from 50 nm to 200 nm) is formed on the second insulating layer 17 and within the second, third, and fourth contact holes by a sputtering method, for example. An indium tin oxide (ITO) film, an IZO film, a zinc oxide (ZnO) film or other such transparent conductive film for example can be used as the conductive film. Here, an ITO film having a thickness of, for example, 100 nm is used as the conductive film.

Next, the transparent conductive film is patterned to form a gate terminal upper connection section, a source terminal upper connection section, and a transfer terminal upper connection section. The gate terminal upper connection section, the source terminal upper connection section, and the transfer terminal upper connection section are used to protect the electrodes or wiring lines exposed at each terminal section. In this manner, the gate terminal section GT, the source terminal section ST, and the transfer terminal section PT are obtained.

Next, the alignment film OM1 is formed to cover the second insulating film 17 and the like. Details of the alignment film OM1 will be described below. The TFT substrate 101 can be manufactured in this manner.

Structure of the Slot Substrate 201

Figure 7:
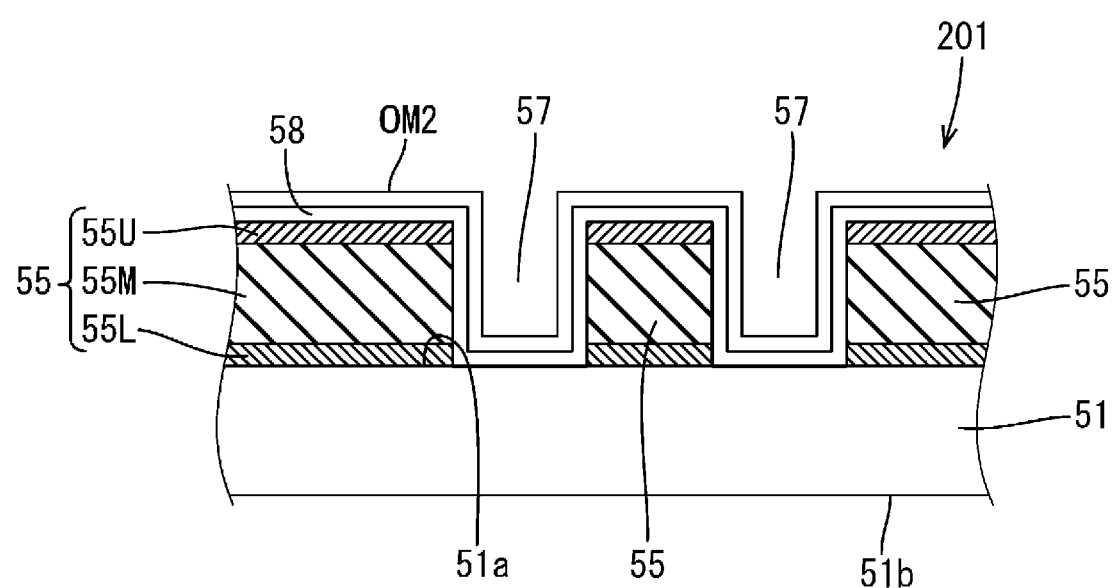
FIG. 7 is a cross-sectional view schematically illustrating an antenna unit region of the slot substrate.

Next, the structure of the slot substrate 201 will be described in greater detail. FIG. 7 is a cross-sectional view schematically illustrating the antenna unit region U of the slot substrate 201.

The slot substrate 201 mainly includes a dielectric substrate 51 (second dielectric substrate), a slot electrode 55 formed on one plate surface 51a (a plate surface facing the liquid crystal layer side, a plate surface facing the TFT substrate 101 side) of the dielectric substrate 51, a third insulating layer 58 covering the slot electrode 55, and an alignment film OM2 covering the third insulating layer 58.

In the transmission and/or reception region R1 of the slot substrate 201, a plurality of slots 57 are formed in the slot electrode 55 (see FIG. 3). The slot 57 is an opening (groove part) that pierces through the slot electrode 55. In this example, one slot 57 is allocated to each antenna unit region U.

The slat electrode 55 includes a main layer 55M such as a Cu layer or an Al layer. The slot electrode 55 may have a layered structure that includes the main layer 55M, as well as an upper layer 55U and a lower layer 55L, disposed sandwiching the main layer 55M therebetween. A thickness of the main layer 55M may be set with consideration of the skin effect according to the material, and may be, for example, from 2 μm to 30 μm. The thickness of the main layer 55M is typically greater than the thickness of the upper layer 55U and the lower layer 55L.

In this example, the main layer 55M is a Cu layer, and the upper layer 55U and the lower layer 55L are Ti layers. By disposing the lower layer 55L between the main layer 55M and the dielectric substrate 51, adherence between the slot electrode 55 and the dielectric substrate 51 can be improved. In addition, by providing the upper layer 55U, corrosion of the main layer 55M (the Cu layer, for example) can be suppressed.

The third insulating layer 58 is formed on the slot electrode 55 and within the slot 57. The material of the third insulating layer 58 is not particularly limited, and, for example, a silicon dioxide ($SiO_2$) film, a silicon nitride ($SiN_x$) film, a silicon oxynitride ($SiO_xN_y$; x>y) film, a silicon nitride oxide ($SiN_xO_y$; x>y) film, or the like can be used as appropriate.

The terminal section IT is provided in the non-transmission and/or reception region R2 of the slot substrate 201 (see FIG. 4). The terminal section IT is provided with: a portion of the slot electrode 55, the third insulating layer 58 covering a portion of the slot electrode 55, and an upper connection section. The third insulating layer 58 includes an opening (contact hole) that reaches a portion of the slot electrode 55. An upper connection section is in contact with a portion of the slot electrode 55 within the opening. In the present embodiment, the terminal section IT is made from a conductive layer such as an ITO film or an IZO film, is disposed in the seal region Rs, and is connected to the transfer terminal section PT on the TFT substrate 101 by a sealing resin containing conductive particles (Au beads or other such conductive beads, for example).

The slot substrate 201 can be manufactured by the following method, for example. First, a dielectric substrate 51 is prepared. A substrate, such as a glass substrate or a resin substrate, having a high transmittance with respect to electromagnetic waves (the dielectric constant εM and the dielectric loss tan δM are small) can be used as the dielectric substrate 51. The dielectric substrate 51 is preferably thin in order to suppress attenuation of the electromagnetic waves. For example, after forming the constituent elements such as the slot electrode 55 on the front surface of the glass substrate by a process to be described later, the glass substrate may be thinned from the rear side. This allows the thickness of the glass substrate to be reduced to 500 μm or less, for example. Generally, the dielectric constant εM and the dielectric loss tan δM of resins are smaller than those of glass. When the dielectric substrate 51 is formed from a resin substrate, the thickness thereof is, for example, from 3 μm to 300 μm. Polyimide or the like is used as the material of the resin base material.

A metal film is formed on the dielectric substrate 51, and this is patterned to obtain the slot electrode 55 having the plurality of slots 57. A Cu film (or an Al film) having a thickness of from 2 μm to 5 μm may be used as the metal film. Here, a layered film obtained by layering a Ti film, a Cu film, and a Ti film in this order is used.

Next, the third insulating layer (having a thickness of from 100 nm to 200 nm, for example) 58 is formed on the slot electrode 55 and within the slots 57. Here, the third insulating layer 58 is formed of a silicon dioxide ($SiO_2$) film.

Subsequently, an opening (contact hole) reaching a portion of the slot electrode 55 is formed in the third insulating layer 58 in the non-transmission and/or reception region R2.

Next, a transparent conductive film is formed on the third insulating layer 58 and within the opening of the third insulating layer 58, and is patterned to form the upper connection section that contacts a portion of the slot electrode 55 within the opening, and the terminal section IT for connecting with the transfer terminal section PT of the TFT substrate 101 is obtained.

Next, the alignment film OM2 is formed to cover the third insulating layer 58. Details of the alignment film OM2 will be described below. The slot substrate 201 can be manufactured in this manner.

Alignment Film OM (OM1, OM2)

The alignment films OM1, OM2 (hereinafter, may be referred to collectively as an "alignment film OM") used on the TFT substrate 101 and the slot substrate 201 of the present embodiment are formed by imidizing a polyamic acid, which is a polymer of a tetracarboxylic acid dianhydride and a diamine, and subjecting the imidized product to an alignment treatment such as a rubbing treatment. The alignment film OM is subjected to an alignment treatment, and thereby a function of aligning the liquid crystal compound in a predetermined direction is expressed.

The polyamic acid is imidized by, for example, heat treating the polyamic acid at a high temperature (e.g., from 200 to 250° C.). Furthermore, chemical imidization methods that use acetic anhydride or the like as a dehydrating agent and pyridine or the like as a catalyst may be used. The imidization rate of the polyamic acid is not particularly limited as long as the object of the disclosure is not impaired, but the imidization rate is preferably at least 50%.

The alignment film OM may be a horizontally-aligned film having an alignment direction that is horizontal to the substrate surface, or may be a vertically aligned film having an alignment direction that is perpendicular to the substrate surface. Furthermore, the polymerization method of the polyamic acid is not particularly limited, and a known method can be used. Moreover, the polyamic acid is dissolved, as appropriate, in an organic solvent and prepared as a liquid or sol composition (alignment agent) having fluidity.

In the present embodiment, the alignment film OM (alignment films OM1, OM2) is formed on the surfaces of both the TFT substrate 101 and the slot substrate 201, but other embodiments may be configured such that the alignment film OM is formed on the surface of only the TFT substrate 101 or the slot substrate 201.

When the alignment film OM is to be formed, first, an alignment agent (polyamic acid-based alignment agent) having fluidity in an uncured state and containing polyamic acid is applied onto the surface of each of the substrates 101, 201 using a coater. The coating is pre-fired (for example, heat treated at 80° C. for 2 minutes), and then subjected to main firing (for example, heat treatment at 210° C. for 10 minutes). Next, the coating after the main firing is rubbed to obtain an alignment film OM having an alignment property of aligning the liquid crystal compound in a predetermined direction. Note that the polyamic acid is imidized during pre-firing or during the main firing.

Liquid Crystal Layer LC (Liquid Crystal Compound)

As the liquid crystal material (liquid crystal compound) constituting the liquid crystal layer, an isothiocyanate group-containing liquid crystal compound having high anisotropy of dielectric constant ($\Delta\varepsilon$) (for example, 10 or greater) is used. Examples of the isothiocyanate group-containing liquid crystal compound that can be used include those represented by Chemical Formulas (2-1) and (2-2) below.

[Chemical Formula 4]

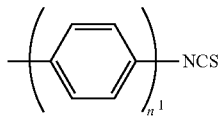
(3-1)

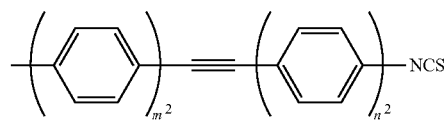
(3-2)

In Chemical Formulas (3-1) and (3-2) above, $n^1$, $m^2$, and $n^2$ are each any integer from 1 to 5, and H in the phenylene group may be substituted with F or Cl.

Note that as the liquid crystal material, a liquid crystal compound besides the isothiocyanate group-containing liquid crystal compound may be included as long as the object of the disclosure is not impaired. The liquid crystal compound (liquid crystal material) used in the liquid crystal layer LC preferably has, for example, an anisotropy of dielectric constant ($\Delta\varepsilon$) of 10 or greater.

Configuration of the Waveguide 301

The waveguide 301 is configured such that the reflective conductive plate 65 opposes the slot electrode 55 with the dielectric substrate 51 interposed therebetween. The reflective conductive plate 65 is disposed opposing the rear surface of the dielectric substrate 51 with an air layer 54 interposed therebetween. Since the reflective conductive plate 65 constitutes a wall of the waveguide 301, the reflective conductive plate 65 preferably has a thickness that is three times or greater than the skin depth, and preferably five times or greater. For example, an aluminum plate, a copper plate, or the like having a thickness of several millimeters and fabricated by a cutting out process can be used as the reflective conductive plate 65.

For example, when the scanning antenna 1000 transmits, the waveguide 301 guides the microwaves supplied by the power feed pin 72 disposed at the center of the plurality of concentrically arranged antenna units U, such that the microwaves spread radially outward. When the microwaves travel through the waveguide 301, the microwaves are cut by each slot 57 of each antenna unit U, and thereby an electric field is generated in accordance with the "slot antenna" principle, and the action of the electric field induces an electric charge in the slot electrode 55 (in other words, the microwaves are converted to the vibration of free electrons in the slot electrode 55). In each antenna unit U, the phase of the vibration of free electrons induced in the patch electrode 15 is controlled by changing the capacitance value of the liquid crystal capacitance through alignment control of the liquid crystal. When an electric charge is induced in the patch electrode 15, an electric field is generated (that is, the vibration of free electrons in the slot electrode 55 is transferred to the vibration of free electrons in the patch electrode 15), and microwaves (radio waves) are oscillated from the patch electrode 15 of each antenna unit U toward the outside of the TFT substrate 101. The azimuthal angle of the beam is controlled by adding together microwaves (radio waves) of different phases, oscillating from each antenna unit U.

In other embodiments, the waveguide may have a two-layer structure separated into an upper layer and a lower layer. In this case, the microwaves supplied by the power feed pin first travel in the lower layer so as to spread radially outward from the center, and then rise to the upper layer at an outer wall portion of the lower layer and travel in the upper layer so as to be collected in the center from the outer side. Configuring the waveguide with such a two-layer structure facilitates the uniform diffusion of microwaves to each antenna unit U.

Antenna Unit U

Figure 8:
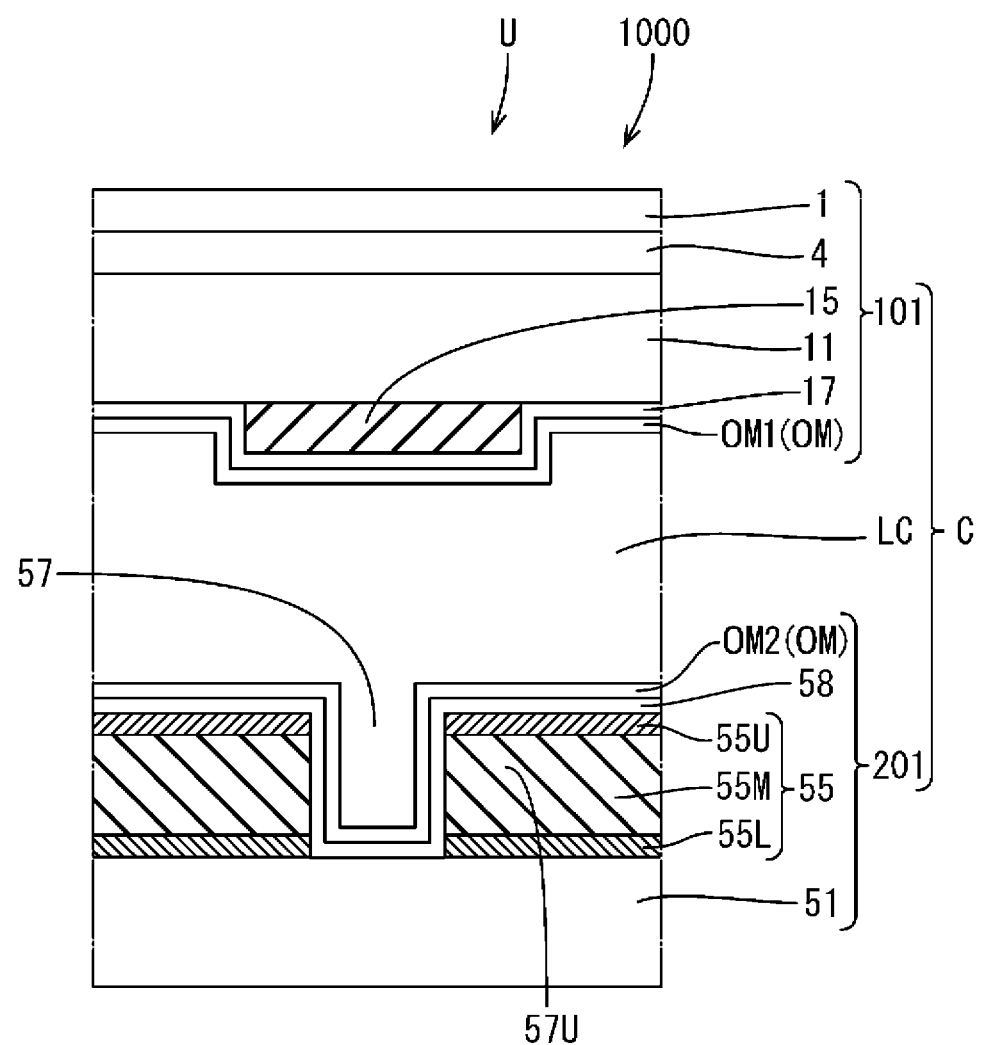
FIG. 8 is a cross-sectional view schematically illustrating a TFT substrate, a liquid crystal layer, and a slot substrate, configuring an antenna unit of a scanning antenna.

FIG. 8 is a cross-sectional view schematically illustrating the TFT substrate 101, the liquid crystal layer LC, and the slot substrate 201 constituting the antenna unit U of the scanning antenna 1000. As illustrated in FIG. 8, in the antenna unit U, the island-shaped patch electrode 15 of the TFT substrate 101 and the hole-shaped (groove-shaped) slot 57 (slot electrode unit 57U) included in the slot electrode 55 of the slot substrate 201 are opposing so as to sandwich the liquid crystal layer LC. Such a scanning antenna 1000 is provided with a liquid crystal cell C having: a liquid crystal layer LC; and a TFT substrate 101 and a slot substrate 201 as a pair sandwiching the liquid crystal layer LC and including alignment films OM1, OM2 on the respective surfaces on the liquid crystal layer LC sides. Note that in the present specification, the antenna unit U is configured to include one patch electrode 15 and a slot electrode 55 (slot electrode unit 57U) in which at least one slot 57 corresponding to the patch electrode 15 is disposed.

Sealing Material

Figure 9:
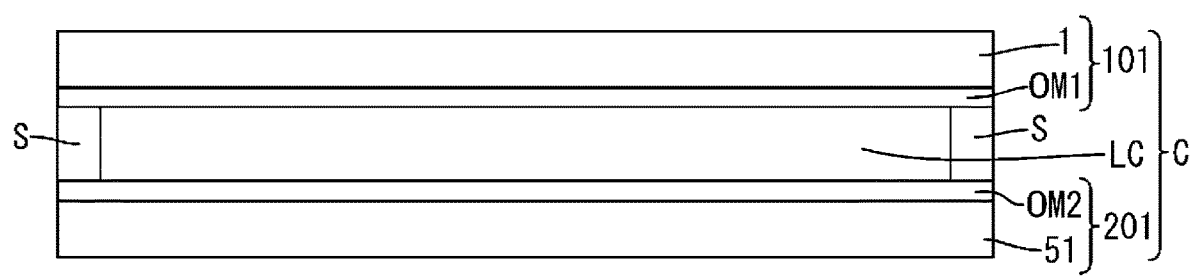
FIG. 9 is a cross-sectional view schematically illustrating a configuration of a liquid crystal cell.

FIG. 9 is a cross-sectional view schematically illustrating a configuration of the liquid crystal cell C. A sealing material S is disposed between the TFT substrate 101 (one example of the first substrate), which is a pair of substrates constituting the liquid crystal cell C, and the slot substrate 201 (one example of the second substrate), in a manner of surrounding the liquid crystal layer LC. The sealing material S is adhered to the TFT substrate 101 and the slot substrate 201, respectively, and has a function of bonding the TFT substrate 101 and the slot substrate 201 to each other. Note that the TFT substrate 101 and the slot substrate 201 form a pair of substrates that face each other while sandwiching the liquid crystal layer LC.

The sealing material S is formed from a cured product of a sealing material composition with thermosetting properties. The sealing material composition primarily contains an unsaturated carbonyl compound and a curing agent.

The unsaturated carbonyl compound (α, β-unsaturated carbonyl compound) is a compound having at least two unsaturated carbonyl groups (α, β-unsaturated carbonyl groups). The unsaturated carbonyl compound is, for example, a compound represented by Chemical Formula (1) below.

[Chemical Formula 5]

In Chemical Formula (1) above, R is H or an alkyl group represented by $C_mH_{2m+1}$, m is any integer from 1 to 6, and * is an atomic bond. Note that from perspectives such as reactivity with the curing agent, R in Chemical Formula (1) above is preferably H or $CH_3$ (methyl group), and is particularly preferably H.

The unsaturated carbonyl group is a thermally reactive functional group, and a double bond (carbon-carbon double bond) is formed between the α carbon adjacent to the carbonyl group, and the β carbon. As described above, the unsaturated carbonyl compound has at least two unsaturated carbonyl groups, and in particular, preferably has one unsaturated carbonyl group at each of both ends of the molecular chain. Note that the structure of the molecular chain bonded to the unsaturated carbonyl group in the unsaturated carbonyl compound is not particularly limited as long as the object of the disclosure is not impaired, and examples thereof include structures containing an aliphatic hydrocarbon and/or an aromatic hydrocarbon.

Specific examples of the molecular chain in the unsaturated carbonyl compound include those of Chemical Formulas (2-1) to (2-8) below. Note that "*" in Chemical Formulas (2-1) to (2-8) below is an atomic bond that is linked to the unsaturated carbonyl group.

[Chemical Formula 6]

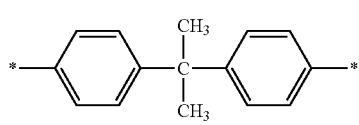 (2-1)

*—$(CH_2)_2$—* (2-2)

*—$(CH_2)_4$—* (2-3)

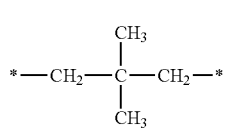 (2-4)

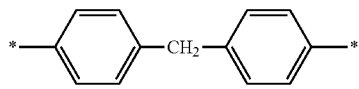 (2-5)

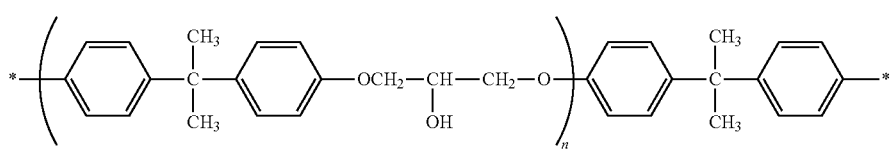 (2-6)

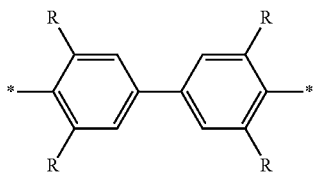
(2-7)

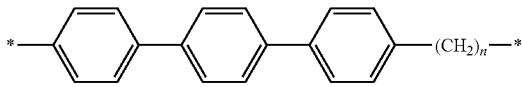
(2-8)

In Chemical Formula (2-6) above, n is any integer from 1 to 5; in Chemical Formula (2-7) above, R is H or CH$_3$ (methyl group); and in Chemical Formula (2-8), n is any integer from 0 to 12.

The curing agent is made from a compound containing a functional group that can thermally react with an unsaturated carbonyl compound. The functional group of the curing agent is composed of one or more types selected from the group consisting of mercaptan groups (thiol groups), hydroxyl groups, and secondary amine groups. The curing agent has at least two such functional groups.

When the functional group is a mercaptan group (thiol group), the curing agent is composed of a mercaptan group-containing compound (thiol group-containing compound). Examples of the mercaptan group-containing compound include compounds represented by Chemical Formulas (7-1) to (7-8) below.

[Chemical Formula 7]

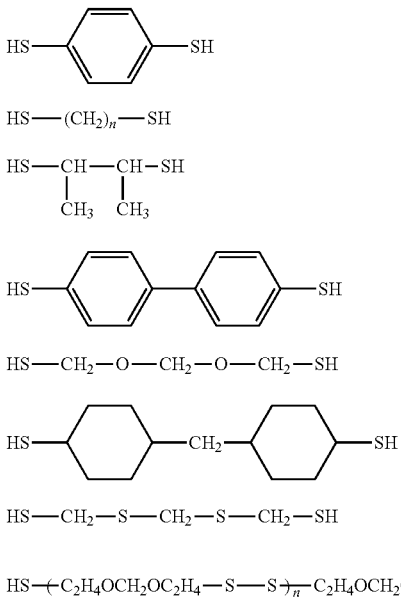

(7-1)
(7-2)
(7-3)
(7-4)
(7-5)
(7-6)
(7-7)
(7-8)

In Chemical Formula (7-2), n is any integer from 1 to 16, and in Chemical Formula (7-8), n is any integer from 1 to 16.

In addition, when the functional group is a secondary amine group, the curing agent is composed of a secondary amine group-containing compound. Examples of the secondary amine group-containing compound include any of compounds represented by Chemical Formulas (8-1) to (8-8) below. Note that X in Chemical Formulas (8-1) to (8-8) below represents a substituent such as an alkyl group or an alkoxy group.

[Chemical Formula 8]

(8-1)

XN—(CH$_2$)$_n$—NX (8-2)

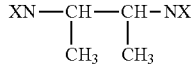
(8-3)

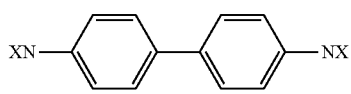
(8-4)

XN—CH$_2$—O—CH$_2$—O—CH$_2$—NX (8-5)

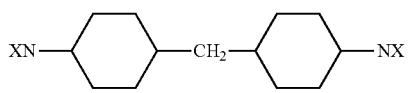
(8-6)

XN—CH$_2$—S—CH$_2$—S—CH$_2$—NX (8-7)

XN—(C$_2$H$_4$OCH$_2$OC$_2$H$_4$—S—S)$_n$—C$_2$H$_4$OCH$_2$OC$_2$H$_4$—NX (8-8)

In Chemical Formula (8-2), n is any integer from 1 to 16, and in Chemical Formula (8-8), n is any integer from 1 to 16.

In addition, when the functional group is a hydroxyl group, the curing agent is composed of a hydroxyl group-containing compound. The hydroxyl group-containing compound is, for example, any of compounds represented by Chemical Formulas (9-1) to (9-8) below.

[Chemical Formula 9]

(9-1)

HO—(CH$_2$)$_n$—OH (9-2)

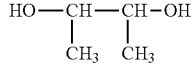
(9-3)

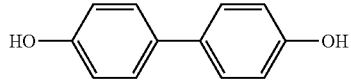
(9-4)

HO—CH$_2$—O—CH$_2$—O—CH$_2$—OH (9-5)

-continued

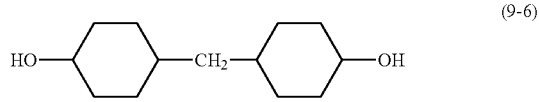

(9-6)

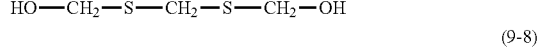

(9-7)

(9-8)

In Chemical Formula (9-2), n is any integer from 1 to 16, and in Chemical Formula (9-8), n is any integer from 1 to 16.

In the sealing material composition, the content amount of the unsaturated carbonyl compound is preferably from 15 mass % to 35 mass %, and the content amount of the curing agent is preferably from 10 mass % to 30 mass %, for example.

In addition, the ratio of the content amount of the unsaturated carbonyl compound to the content amount of the curing agent is preferably from 1.0 to 1.5, for example.

Figure 10:
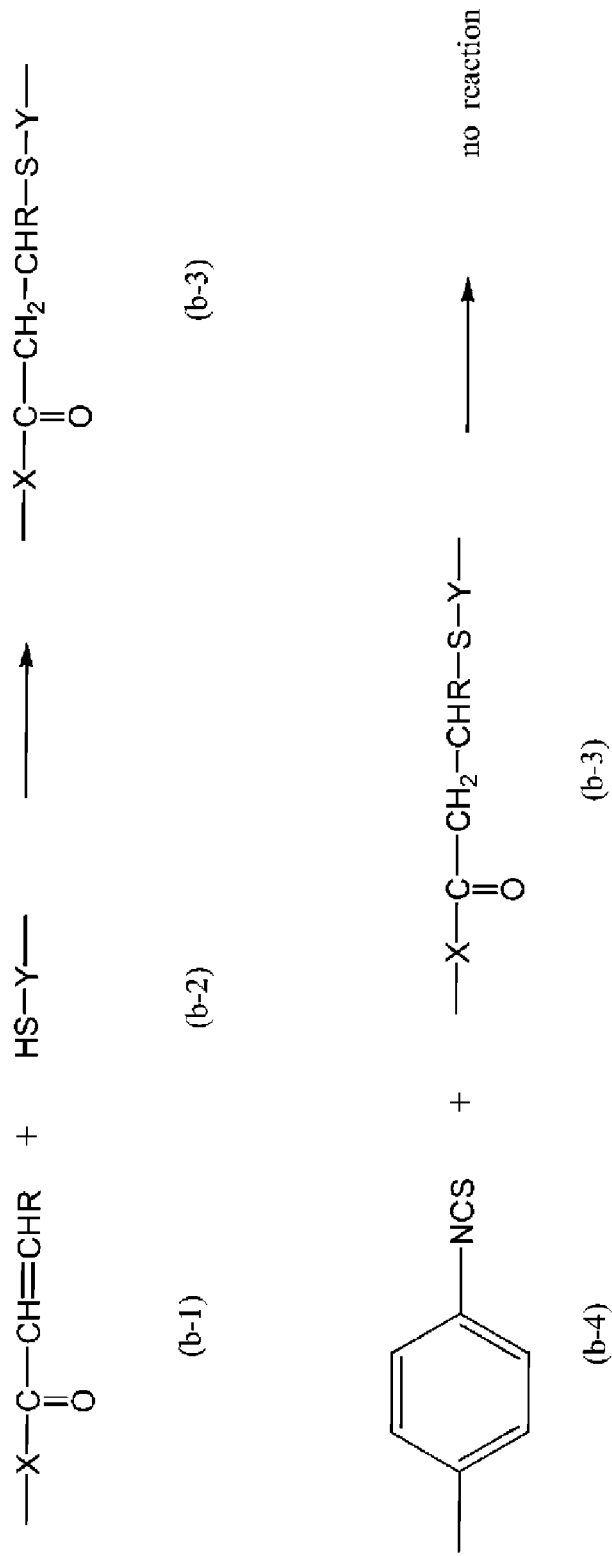
FIG. 10 is an explanatory diagram illustrating that a reaction product between an unsaturated carbonyl compound and a curing agent does not react with the isothiocyanate group-containing liquid crystal compound.

When the sealing material composition including the unsaturated carbonyl compound and the curing agent is heated, the unsaturated carbonyl groups (α, β-unsaturated carbonyl groups) of the unsaturated carbonyl compound react (undergo, for example, a nucleophilic conjugate addition reaction) with the functional groups of the curing agent, and a polymer (cured product) composed of the unsaturated carbonyl compound and the curing agent is obtained. For example, as illustrated in FIG. 10, an unsaturated carbonyl compound (b-1) having an unsaturated carbonyl group, and a curing agent (b-2) made from a mercaptan group-containing compound react (undergo a nucleophilic conjugate addition reaction) with each other when heated, and a compound (b-3) is obtained as a cured product. Note that X of the unsaturated carbonyl compound (b-1) and Y of the curing agent (b-2) represent any structure. Moreover, R of the unsaturated carbonyl compound (b-1) is H or an alkyl group such as a methyl group. A functional group (—OH, —NH—) containing a highly reactive hydrogen group is not left in the compound (b-3) thus obtained, and therefore, the compound (b-3) and the isothiocyanate group of the isothiocyanate group-containing liquid crystal compound (b-4) do not mutually react. Thus, the occurrence (precipitation) of a reaction product originating from the sealing material composition in the liquid crystal layer is suppressed, and the reliability of the liquid crystal cell and the scanning antenna is improved.

The sealing material composition may further include other components such as a silane coupling agent, a filler, a gelling agent, and a sensitizer as long as the object of the disclosure is not impaired. Note that a solvent-free system is basically used as the sealing material.

The sealing material composition is applied in a predetermined shape (for example, a frame shape) onto the surface of the TFT substrate 101 or the slot substrate 201 using a sealing plate or the like. Next, the sealing material composition is heated and cured as appropriate, and becomes a sealing material.

Method for Manufacturing a Scanning Antenna

The method for manufacturing the scanning antenna (method for manufacturing the liquid crystal cell) includes a step of bonding the TFT substrate 101 and the slot substrate 201 to each other with the sealing material S interposed therebetween, and injecting the liquid crystal layer LC between the TFT substrate 101 and the slot substrate 201. Examples of the method for injecting the liquid crystal material include dropwise injection (ODF) and vacuum injection. Here, a method for manufacturing the liquid crystal cell C using a vacuum injection method will be described. First, the sealing material composition is applied using a sealing plate or the like to either the TFT substrate 101 or the slot substrate 201 (here, the TFT substrate 101 is used) prepared in advance. When applied, the sealing material composition is applied in a predetermined pattern shape (frame shape). Next, the sealing material composition on the substrate is heated and temporarily cured. Subsequently, the substrate (TFT substrate 101) and the other substrate (slot substrate 201) are bonded together in a manner that sandwiches the sealing material composition after temporary curing. Next, the sealing material composition is heated and subjected to main curing. Note that an injection port for injecting the liquid crystal material is formed in the cured product of the sealing material composition.

Subsequently, the liquid crystal material (containing the isothiocyanate group-containing liquid crystal compound) is injected into the liquid crystal cell C from the injection port under reduced pressure by a vacuum injection method. A sealant is then applied under ordinary pressure to plug the injection port. The sealant is a thermosetting or photocurable material, and is appropriately cured. In this manner, the liquid crystal cell C can be fabricated using the vacuum injection method.

After the liquid crystal cell C has been produced, the reflective conductive plate 65 is assembled, as appropriate, at the cell side so as to oppose the opposite surface of the slot substrate 201 (second dielectric substrate 51) with a dielectric (air layer) 54 interposed therebetween. Through such a step, the scanning antenna of the present embodiment is manufactured.

In the embodiment described above, the sealing material composition was applied to the liquid crystal cell used in the scanning antenna, but as long as the object of the disclosure is not impaired, the sealing material composition may be applied to a liquid crystal cell for use in other devices (for example, a liquid crystal cell for a liquid crystal lens that uses liquid crystal as an optical element to control the focal length through an applied voltage).

EXAMPLES

The disclosure will be further described below based on examples. However, the disclosure is not limited in any way by the examples.

Example 1

Fabrication of a Liquid Crystal Cell for a Scanning Antenna

A TFT substrate with the same basic configuration as the TFT substrate 101 included in the liquid crystal cell of the scanning antenna 1000 described above, and a slot substrate having the same basic configuration as the slot substrate 201 included in the liquid crystal cell were respectively prepared. The alignment film of the TFT substrate and the alignment film of the slot substrate were formed using an alignment agent (polyamic acid-based alignment agent) formed by dissolving polyamic acid in an organic solvent.

When forming each of the alignment films on the TFT substrate and the slot substrate, first, the alignment agent was applied using an inkjet method, and a coating film composed of the alignment agent was formed on each substrate. Next, each of the coating films on each substrate was heated (pre-fired) for 2 minutes at a temperature of 80° C., and then the coating films were heated (main firing) for 10 minutes at a temperature of 200° C.

Subsequently, a rubbing treatment (alignment treatment) was performed on each of the coating films on each substrate to form respective alignment films composed of the alignment agent described above on the surfaces of both the TFT substrate and the slot substrate.

A below-described sealing material composition having thermal curability was applied in a frame shape using a sealing plate onto a surface (alignment film side) of the TFT substrate, and the frame-shaped sealing material composition was temporarily cured by heating for 10 minutes at a temperature of 100° C. Next, the TFT substrate and the slot substrate were pasted together in a form of sandwiching the sealing material composition, and in this state, the sealing material composition was cured by heating for 30 minutes at a temperature of 200° C. In this manner, an empty cell having the TFT substrate and the slot substrate pasted together with the sealing material composed of the cured sealing material composition interposed therebetween, was formed.

Next, a liquid crystal material containing isothiocyanate group-containing liquid crystal compounds represented by Chemical Formula (3-1) and Chemical Formula (3-2) above (nematic-isotropic phase transition temperature (Tni): 145° C., $\Delta\varepsilon=20$, $\Delta n=0.35$) was injected into the empty cell by a vacuum injection method, and a liquid crystal cell was obtained. Note that the Tni of the liquid crystal material described herein was determined by analyzing the thermal behavior of the liquid crystal material using a thermal property measurement device (available from Mettler Toledo), a differential scanning calorimeter (DSC), or the like.

A composition containing an unsaturated carbonyl compound (25 mass %) represented by Chemical Formula (10) below and a mercaptan-based curing agent (20 mass %) represented by Chemical Formula (11) below was used as the sealing material composition. Note that the sealing material composition includes other components such as fillers.

[Chemical Formula 10]

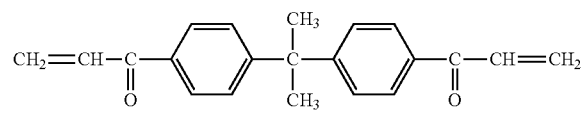

[Chemical Formula 11]

-continued

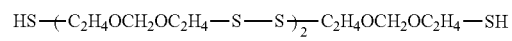

Comparative Example 1

A liquid crystal cell of Comparative Example 1 was produced in the same manner as Example 1 using a sealing material composition prepared in the same manner as Example 1 with the exception that an epoxy compound (25 mass %) represented by Chemical Formula (12) below was used in place of the unsaturated carbonyl compound represented by Chemical Formula (10) above. Note that the sealing material composition includes other components such as fillers.

[Chemical Formula 12]

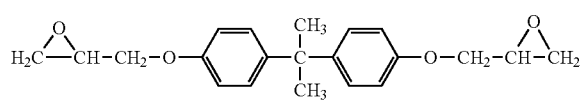

Comparative Example 2

A liquid crystal cell of Comparative Example 2 was produced in the same manner as Example 1 with the exception that the same sealing material composition as that of Comparative Example 1 was used, and a liquid crystal material (Tni: 105° C., $\Delta\varepsilon=7$, $\Delta n=0.12$) not containing an isothiocyanate group was used.

High Temperature Storage Test

Each liquid crystal cell of Example 1 and Comparative Examples 1 and 2 was left sitting (aged) for 500 hours in a constant-temperature bath at 90° C., and the voltage holding ratio (VHR) of the liquid crystal cell before and after being left sitting (when the test was started (0 hours) and at 500 hours after starting the test) was measured, the residual DC voltage (rDC) was measured, and the presence or absence of precipitates in the liquid crystal material was confirmed.

Note that the voltage holding ratio was measured using a 6254 type VHR measurement system (available from Toyo Corporation) under conditions of 1 V and 70° C. Moreover, the residual DC voltage (V) was measured by the flicker elimination method after a DC offset voltage of 2 V was applied to the liquid crystal cell for 2 hours in an oven with a temperature of 40° C. Additionally, the presence or absence of precipitates (solids) in the liquid crystal material was visually confirmed. The generation of precipitates in the liquid crystal material was indicated by "yes", and the lack of precipitate generation was indicated by "none". The results are shown in Table 1.

TABLE 1

|  | Sealing Material Composition | | 0 Hours | | | 500 Hours | | |
|---|---|---|---|---|---|---|---|---|
|  |  |  | VHR (%) | rDC (V) | Presence of precipitates | VHR (%) | rDC (V) | Presence of precipitates |
| Example 1 | Chemical Formula (10) 25 wt. % | Chemical Formula (11) 20 wt. % | 77 | 0.06 | None | 40 | 0.17 | None |
| Comparative Example 1 | Chemical Formula (12) 25 wt. % | Chemical Formula (11) 20 wt. % | 75 | 0.08 | None | 34 | 0.42 | Yes |
| Comparative Example 2 | Chemical Formula (10) 25 wt. % | Chemical Formula (11) 20 wt. % | 99 | 0.05 | None | 98 | 0.05 | None |

Figure 1:
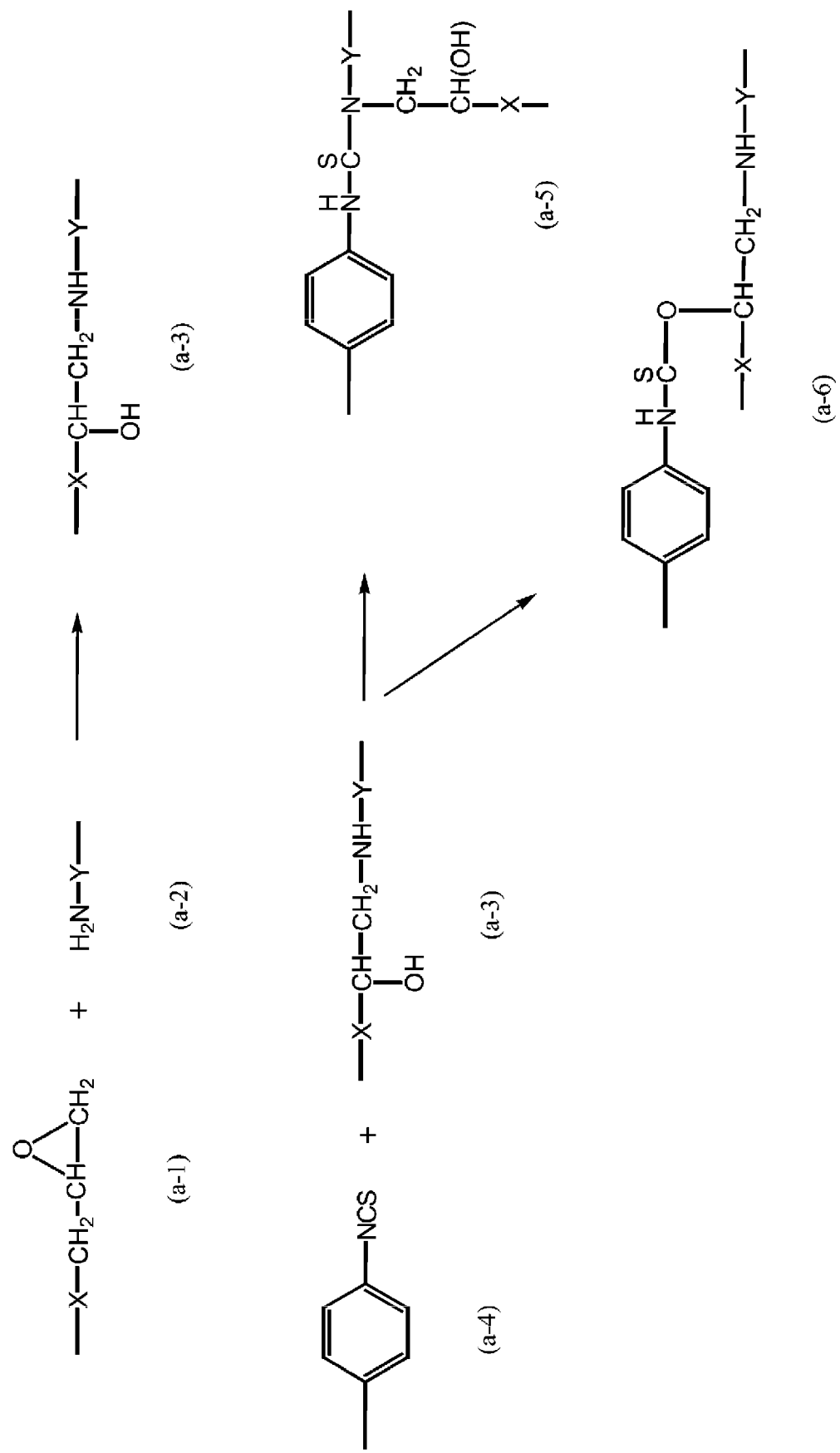
FIG. 1 is an explanatory diagram illustrating a reaction between an isothiocyanate group-containing liquid crystal compound and an epoxy-derived component.

Example 1 is a case in which the sealing material composition containing the unsaturated carbonyl compound represented by Chemical Formula (10) above and the mercaptan-based curing agent represented by Chemical Formula (11) above was used. With the liquid crystal cell of Example 1, as shown in Table 1, solid precipitates were not produced after the liquid crystal cell was stored for 500 hours in a 90° C. environment. The increase in the VHR and rDC after left standing for 500 hours was small compared to Comparative Example 1. In contrast, in the case (Comparative Example 1) in which the sealing material composition containing the epoxy compound represented by Chemical Formula (12) above was used in place of the unsaturated carbonyl compound, the generation of solid precipitates was confirmed in a portion near the sealing material after the composition was stored for 500 hours in a 90° C. environment. It is assumed that the reason for this occurrence of precipitates is that when an epoxy compound was used, a highly reactive hydrogen group (hydrogen group in the hydroxyl group) was present even after the completion of the curing reaction of the sealing material (sealing material composition), and this hydrogen group reacted with the isothiocyanate group contained in the liquid crystal material (see FIG. 1), and as a result, insoluble material was produced in the liquid crystal layer. In addition, the VHR and rDC of Comparative Example 1 after left standing for 500 hours were both relatively worse than those of Example 1. It is also assumed that another reason for the occurrence of precipitates is that impurities were incorporated in the liquid crystal layer by a reaction between the isothiocyanate groups in the liquid crystal material, and the sealing material containing the reaction product of the epoxy compound. Furthermore, in Comparative Example 2, a liquid crystal material for use in LCDs and not containing an isothiocyanate-based compound was used, and no insoluble matter was generated in the vicinity of the sealing material, and the VHR and rDC after being left to stand for 500 hours were both good. However, the anisotropy of dielectric constant of liquid crystal materials for LCD use is insufficient, and directivity in the GHz band cannot be obtained, and thus such liquid crystal materials for LCD use cannot be used in antenna applications.

Example 2

A liquid crystal cell of Example 2 was produced in the same manner as in Example 1 with the exception that a sealing material composition containing an unsaturated carbonyl compound (25 mass %) represented by Chemical Formula (13) below and a hydroxyl-based curing agent (20 mass %) represented by Chemical Formula (14) was used in place of the sealing material composition of Example 1. Note that the sealing material composition includes other components such as fillers.

[Chemical Formula 13]

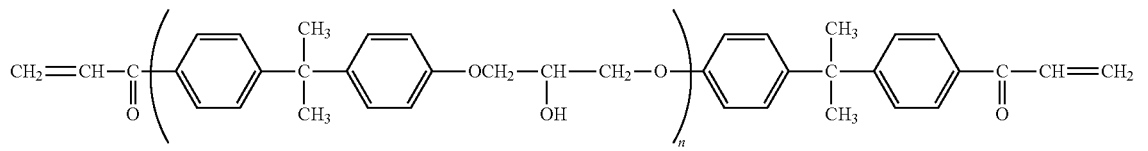

(13)

In Chemical Formula (13) above, n is any integer from 1 to 5.

[Chemical Formula 14]

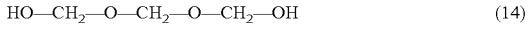

(14)

Furthermore, the liquid crystal cell of Example 2 was subjected to the above-described high temperature storage test, and as in Example 1, the VHR of the liquid crystal cell at the start of the test (0 hours) and at 500 hours after the start of the test was measured, the residual DC voltage (rDC) was measured, and the presence or absence of precipitates in the liquid crystal material was confirmed. The results are shown in Table 2.

TABLE 2

| | Sealing Material Composition | | 0 Hours | | | 500 Hours | | |
|---|---|---|---|---|---|---|---|---|
| | | | VHR (%) | rDC (V) | Presence of precipitates | VHR (%) | rDC (V) | Presence of precipitates |
| Example 2 | Chemical Formula (13) 25 wt. % | Chemical Formula (14) 20 wt. % | 73 | 0.04 | None | 43 | 0.14 | None |

Example 2 is a case in which a hydroxyl group-containing compound (hydroxyl-based curing agent) represented by Chemical Formula (14) above was used as a curing agent along with an unsaturated carbonyl compound represented by Chemical Formula (13) above. In this case, no solid precipitates were generated after the high temperature storage test (after 500 hours), and good results were obtained for both VHR and rDC compared to Comparative Example 1 described above.

Example 3

A liquid crystal cell of Example 3 was produced in the same manner as in Example 2 with the exception that a secondary amine-based curing agent (20 mass %) represented by Chemical Formula (15) below was used in place of the hydroxyl-based curing agent in the sealing material composition of Example 2. Note that the sealing material composition includes other components such as fillers.

[Chemical Formula 15]

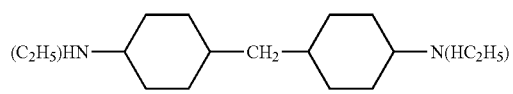

(15)

Comparative Example 3

A liquid crystal cell of Comparative Example 3 was produced in the same manner as in Example 3 with the exception that a primary amine-based curing agent (20 mass %) represented by Chemical Formula (16) below was used in place of the secondary amine-based curing agent in the sealing material composition of Example 3. Note that the sealing material composition includes other components such as fillers.

[Chemical Formula 16]

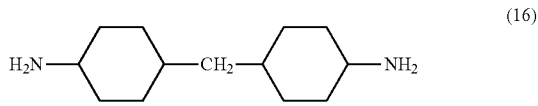

(16)

Furthermore, the liquid crystal cells of Example 3 and Comparative Example 3 were subjected to the above-described high temperature storage test, and as in Example 1, the VHR of the liquid crystal cells at the start of the test (0 hours) and at 500 hours after the start of the test was measured, the residual DC voltage (rDC) was measured, and the presence or absence of precipitates in the liquid crystal material was confirmed. The results are shown in Table 3.

TABLE 3

| | Sealing Material Composition | | 0 Hours | | | 500 Hours | | |
|---|---|---|---|---|---|---|---|---|
| | | | VHR (%) | rDC (V) | Presence of precipitates | VHR (%) | rDC (V) | Presence of precipitates |
| Example 3 | Chemical Formula (13) 25 wt. % | Chemical Formula (15) 20 wt. % | 80 | 0.03 | None | 46 | 0.11 | None |
| Comparative Example 3 | Chemical Formula (13) 25 wt. % | Chemical Formula (16) 20 wt. % | 80 | 0.03 | None | 40 | 0.19 | Yes |

Example 3 is a case in which a secondary amine compound (secondary amine-based curing agent) represented by Chemical Formula (15) above was used as a curing agent along with the unsaturated carbonyl compound represented by Chemical Formula (13) above. In this case, no solid precipitates were generated after the high temperature storage test (after 500 hours), and the increase in VHR and rDC was relatively small.

Comparative Example 3 is a case in which a primary amine compound (primary amine-based curing agent) represented by Chemical Formula (16) above was used as a curing agent along with an unsaturated carbonyl compound represented by Chemical Formula (13) above. In this case, the generation of solid precipitates was confirmed in a portion near the sealing material after the composition was stored for 500 hours in a 90° C. environment. It is assumed that the reason for this occurrence of precipitates is that when a primary amine compound was used, a highly reactive hydrogen group (—NH— in the amino group) was present even after the completion of the curing reaction of the sealing material composition, and this hydrogen group reacted with the isothiocyanate group contained in the liquid crystal material for the antenna, and as a result, insoluble material was produced in the liquid crystal layer. Furthermore, the VHR and rDC of Comparative Example 3 were both relatively worse than that of Example 3. It is also assumed that another reason for the occurrence of precipitates is that impurities were incorporated into the liquid crystal layer by a reaction between the isothiocyanate group contained in the liquid crystal material, and the hydrogen group in the amino group.

REFERENCE SIGNS LIST

1 Dielectric substrate (first dielectric substrate)
3 Gate electrode
4 Gate insulating layer
5 Semiconductor layer
6D Drain contact layer
6S Source contact layer
7D Drain electrode
7S Source electrode
10 TFT
11 First insulating layer
15 Patch electrode
17 Second insulating layer
51 Dielectric substrate (second dielectric substrate
55 Slot electrode
55L Lower layer
55M Main layer
55U Upper layer
57 Slot
57U Slot electrode unit
58 Third electrode
70 Power feed device
72 Power feed pin
101 TFT substrate
201 Slot substrate
1000 Scanning antenna
U Antenna unit (antenna unit region)
CH1 Contact hole
LC Liquid crystal layer
C Liquid crystal cell
GD Gate driver
GL Gate bus line
GT Gate terminal section
SD Source driver
SL Source bus line
ST Source terminal section
PT Transfer terminal section
R1 Transmission and/or reception region
R2 Non-transmission and/or reception region
Rs Seal region
S Sealing material
OM, OM1, OM2 Alignment film

The invention claimed is:
1. A sealing material composition comprising:
an unsaturated carbonyl compound having at least two unsaturated carbonyl groups; and
a curing agent being thermally reactive with the unsaturated carbonyl compound and comprising a compound comprising at least two of one or more kinds of functional groups selected from the group consisting of a mercaptan group, a hydroxyl group, and a secondary amine group,
wherein the unsaturated carbonyl group is represented by Chemical Formula (1),

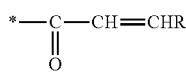 (1)

in Chemical Formula (1) above, R is H or an alkyl group represented by $C_mH_{2m+1}$, m is any integer from 1 to 6, and * is an atomic bond, and
the unsaturated carbonyl compound comprises any of structures represented by Chemical Formulas (2-3), (2-4), (2-5), (2-7) or (2-8) as a molecular chain bonded to the unsaturated carbonyl group,

 (2-3)

 (2-4)

 (2-5)

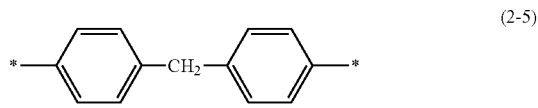 (2-7)

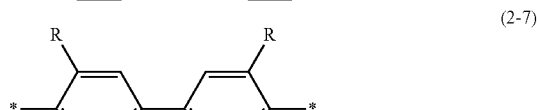 (2-8)

in Chemical Formulas (2-3), (2-4), (2-5), (2-7) and (2-8) above, "*" is an atomic bond linked to the unsaturated carbonyl group; in Chemical Formula (2-7), R is H or $CH_3$; and in Chemical Formula (2-8), n is any integer from 0 to 12.

2. The sealing material composition according to claim 1, wherein the curing agent comprises a mercaptan group-containing compound for which the functional group is the mercaptan group.

3. The sealing material composition according to claim 1, wherein the curing agent comprises a secondary amine group-containing compound for which the functional group is the secondary amine group.

4. A liquid crystal cell comprising:
a liquid crystal layer;
a pair of mutually facing substrates comprising a first substrate and a second substrate, sandwiching the liquid crystal layer; and
a sealing material comprising a cured product of the sealing material composition described in claim 1, and interposed between the pair of substrates in a manner of adhering to each of the pair of substrates while surrounding the liquid crystal layer.

5. A scanning antenna having a plurality of antenna units arranged therein, the scanning antenna comprising:
a TFT substrate comprising a first dielectric substrate, a plurality of TFTs supported by the first dielectric substrate, and a plurality of patch electrodes electrically connected to the TFTs;
a slot substrate comprising a second dielectric substrate and a slot electrode comprising a plurality of slots formed on a first main surface of the second dielectric substrate;

a liquid crystal layer provided between the TFT substrate and the slot substrate;

a reflective conductive plate disposed in a manner of opposing a second main surface opposite the first main surface of the second dielectric substrate with a dielectric layer interposed therebetween; and a sealing material comprising a cured product of the sealing material composition described in claim 1, the sealing material being interposed between the TFT substrate and the slot substrate in a manner of adhering to each of the TFT substrate and the slot substrate while surrounding the liquid crystal layer.

6. The scanning antenna according to claim 5, wherein the liquid crystal layer comprises an isothiocyanate group-containing liquid crystal compound.

7. The scanning antenna according to claim 6, wherein the isothiocyanate group-containing liquid crystal compound comprises a structure represented by Chemical Formula (3-1) or (3-2) below,

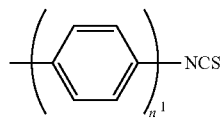

(3-1)

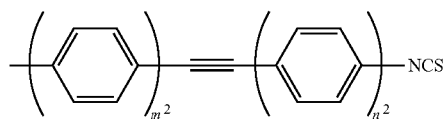

(3-2)

in Chemical Formulas (3-1) and (3-2) above, $n^1$, $m^2$, and $n^2$ are each any integer from 1 to 5, and H in the phenylene group may be substituted with F or Cl.

8. The sealing material composition according to claim 2, wherein the mercaptan group-containing compound includes any of compounds represented by Chemical Formulas (7-1) to (7-8),

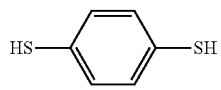

(7-1)

(7-2)

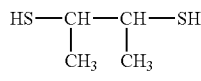

(7-3)

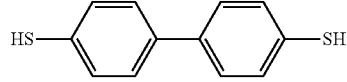

(7-4)

HS—CH₂—O—CH₂—O—CH₂—SH  (7-5)

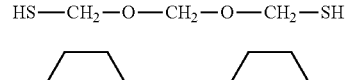

(7-6)

HS—CH₂—S—CH₂—S—CH₂—SH  (7-7)

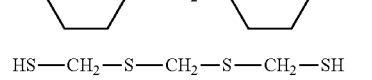

(7-8)

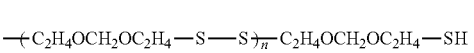

in Chemical Formula (7-2) above, n is any integer from 1 to 16, and in Chemical Formula (7-8), n is any integer from 1 to 16.

9. The sealing material composition according to claim 3, the secondary amine group-containing compound includes any of compounds represented by Chemical Formulas (8-1) to (8-8),

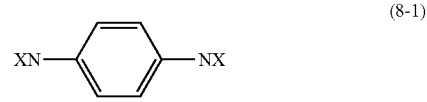

(8-1)

XN—(CH₂)ₙ—NX  (8-2)

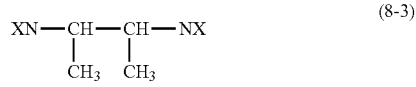

(8-3)

(8-4)

XN—CH₂—O—CH₂—O—CH₂—NX  (8-5)

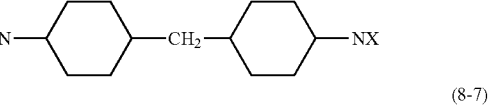

(8-6)

XN—CH₂—S—CH₂—S—CH₂—NX  (8-7)

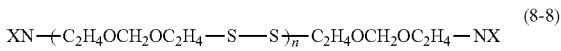

(8-8)

X in Chemical Formulas (8-2) to (8-8) above represents a substituent such as an alkyl group or an alkoxy group, and in Chemical Formula (8-2), n is any integer from 1 to 16, and in Chemical Formula (8-8), n is any integer from 1 to 16.

10. A sealing material composition comprising:

an unsaturated carbonyl compound having at least two unsaturated carbonyl groups; and a curing agent being thermally reactive with the unsaturated carbonyl compound and comprising a compound comprising at least two of one or more kinds of functional groups selected from the group consisting of a mercaptan group, a hydroxyl group, and a secondary amine group, wherein the unsaturated carbonyl group is represented by Chemical Formula (1),

(1)

in Chemical Formula (1) above, R is H or an alkyl group represented by $C_mH_{2m+1}$, m is any integer from 1 to 6, and * is an atomic bond, the unsaturated carbonyl compound comprises any of structures represented by Chemical Formulas (2-1) to (2-8) as a molecular chain bonded to the unsaturated carbonyl group, (2-1)
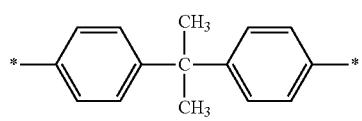

(2-2)

(2-3)

(2-4)
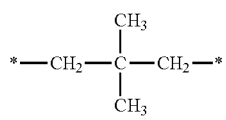

(2-5)
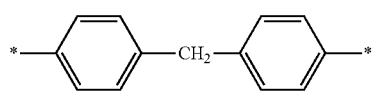

(2-6)
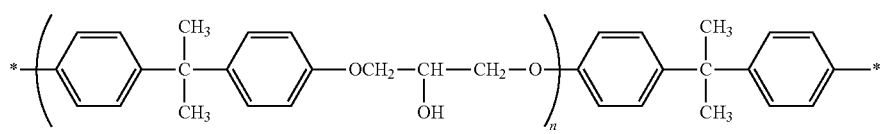

(2-7)
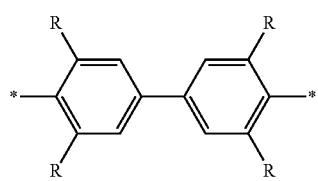

(2-8)
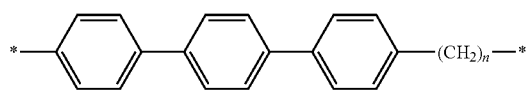

in Chemical Formulas (2-1) to (2-8) above, "*" is an atomic bond linked to the unsaturated carbonyl group; in Chemical Formula (2-6), n is any integer from 1 to 5; in Chemical Formula (2-7), R is H or $CH_3$; and in Chemical Formula (2-8), n is any integer from 0 to 12, the curing agent comprises a mercaptan group-containing compound for which the functional group is the mercaptan group, and the mercaptan group-containing compound includes compounds represented by Chemical Formulas (7-1) to (7-8), (7-1)
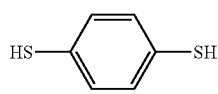

(7-2)

(7-3)
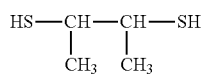

(7-4)
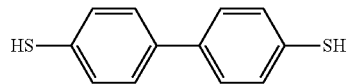

-continued (7-5)
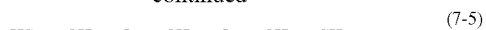

(7-6)
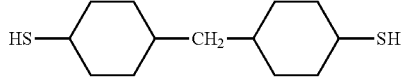

(7-7)

(7-8)

in Chemical Formula (7-2) above, n is any integer from 1 to 16, and in Chemical Formula (7-8), n is any integer from 1 to 16.

11. The sealing material composition according to claim 10, wherein the curing agent comprises a secondary amine group-containing compound for which the functional group is the secondary amine group.

12. The sealing material composition according to claim 11, the secondary amine group-containing compound includes any of compounds represented by Chemical Formulas (8-1) to (8-8),

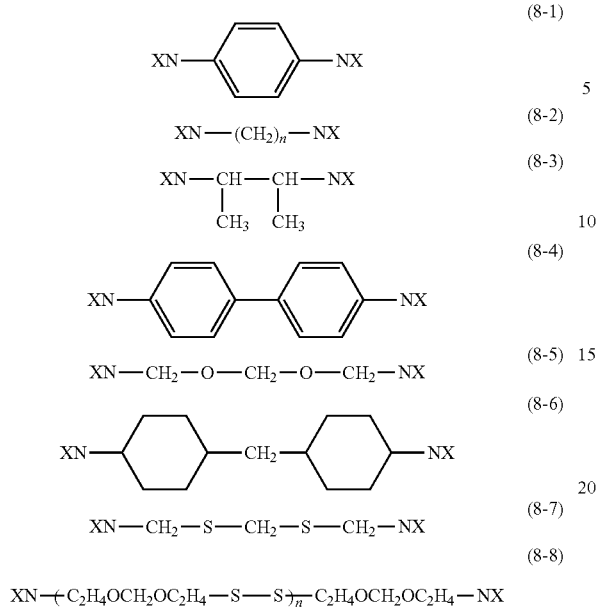

(8-1)
(8-2)
(8-3)
(8-4)
(8-5)
(8-6)
(8-7)
(8-8)

X in Chemical Formulas (8-2) to (8-8) above represents a substituent such as an alkyl group or an alkoxy group, and in Chemical Formula (8-2), n is any integer from 1 to 16, and in Chemical Formula (8-8), n is any integer from 1 to 16.

13. A liquid crystal cell comprising:
a liquid crystal layer;
a pair of mutually facing substrates comprising a first substrate and a second substrate, sandwiching the liquid crystal layer; and
a sealing material comprising a cured product of the sealing material composition described in claim 12, and interposed between the pair of substrates in a manner of adhering to each of the pair of substrates while surrounding the liquid crystal layer.

14. A scanning antenna having a plurality of antenna units arranged therein, the scanning antenna comprising:
a TFT substrate comprising a first dielectric substrate, a plurality of TFTs supported by the first dielectric substrate, and a plurality of patch electrodes electrically connected to the TFTs;
a slot substrate comprising a second dielectric substrate and a slot electrode comprising a plurality of slots formed on a first main surface of the second dielectric substrate;
a liquid crystal layer provided between the TFT substrate and the slot substrate;
a reflective conductive plate disposed in a manner of opposing a second main surface opposite the first main surface of the second dielectric substrate with a dielectric layer interposed therebetween; and
a sealing material comprising a cured product of the sealing material composition described in claim 12, the sealing material being interposed between the TFT substrate and the slot substrate in a manner of adhering to each of the TFT substrate and the slot substrate while surrounding the liquid crystal layer.

15. The sealing material composition according to claim 12,
wherein the unsaturated carbonyl compound is represented by Chemical Formula (10),

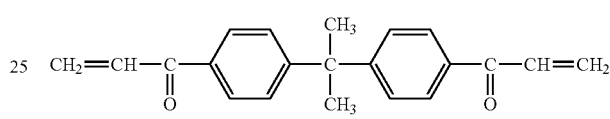

(10)

and the curing agent is represented by Chemical Formula (11)

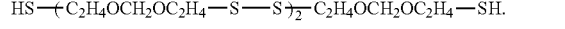

(11)

16. The sealing material composition according to claim 12,
wherein the unsaturated carbonyl compound is represented by Chemical Formula (13),

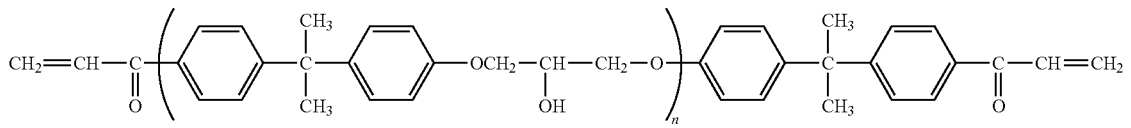

(13)

in Chemical Formula (13), n is any integer from 1 to 5, and
the curing agent is represented by Chemical Formula (14)

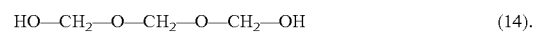

(14).

17. The sealing material composition according to claim 12,
wherein the unsaturated carbonyl compound is represented by Chemical Formula (13),

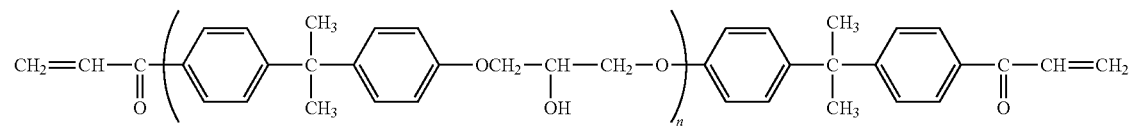
in Chemical Formula (13), n is any integer from 1 to 5, and
the curing agent is represented by Chemical Formula (15)
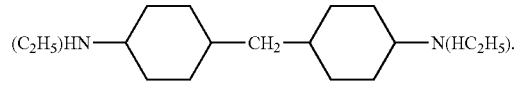
* * * * *